United States Patent
Soma et al.

(10) Patent No.: US 9,835,660 B2
(45) Date of Patent: Dec. 5, 2017

(54) CURRENT DETECTION METHOD OF SEMICONDUCTOR DEVICE AND SEMICONDUCTOR DEVICE

(71) Applicant: Renesas Electronics Corporation, Tokyo (JP)

(72) Inventors: Osamu Soma, Tokyo (JP); Akira Uemura, Tokyo (JP); Kenji Amada, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 16 days.

(21) Appl. No.: 15/068,929

(22) Filed: Mar. 14, 2016

(65) Prior Publication Data

US 2016/0305989 A1     Oct. 20, 2016

(30) Foreign Application Priority Data

Apr. 14, 2015 (JP) .................................. 2015-082772

(51) Int. Cl.
*G01R 19/32* (2006.01)
*G01R 1/20* (2006.01)
*G01R 15/09* (2006.01)

(52) U.S. Cl.
CPC .............. *G01R 19/32* (2013.01); *G01R 1/203* (2013.01); *G01R 15/09* (2013.01)

(58) Field of Classification Search
CPC combination set(s) only.
See application file for complete search history.

(56) References Cited

U.S. PATENT DOCUMENTS

| | | | |
|---|---|---|---|
| 5,815,027 A | 9/1998 | Tihanyi et al. | |
| 2002/0024376 A1* | 2/2002 | Sander | G01R 19/0092 327/407 |
| 2004/0003957 A1* | 1/2004 | Matsuoka | B62D 6/10 180/446 |
| 2006/0139822 A1* | 6/2006 | Kurita | G01R 31/3008 361/56 |
| 2016/0065067 A1* | 3/2016 | Isham | H02M 3/158 323/271 |

FOREIGN PATENT DOCUMENTS

JP     H 08-334534 A     12/1996

* cited by examiner

*Primary Examiner* — Clayton E Laballe
*Assistant Examiner* — Jas Sanghera
(74) *Attorney, Agent, or Firm* — McGinn IP Law Group, PLLC

(57) ABSTRACT

A semiconductor device with the highly precise current detecting function is provided. Current detection is performed using a semiconductor device in which two semiconductor chips are mounted in one package. The first semiconductor chip is provided with an electric power supply transistor to supply power to a load via a load driving terminal, and a current detection circuit to detect a current flowing through the load driving terminal. In the inspection process of the semiconductor device, the electrical property of the current detection circuit in the first semiconductor chip is inspected, and the information on a correction equation obtained as the inspection result is written in a memory circuit of the second semiconductor chip. The second semiconductor chip corrects the detection result obtained by the current detection circuit based on the information on the correction equation written in the memory circuit concerned.

19 Claims, 17 Drawing Sheets

| Ta | 25°C | −40°C | 150°C |
|---|---|---|---|
| V1 | V1r | V1l | V1h |
| V2 | V2r | V2l | V2h |
| α | αr | αl | αh |
| β | βr | βl | βh |
| VF | VFr | VFl | VFh |

CURRENT DETECTION METHOD OF SEMICONDUCTOR DEVICE AND SEMICONDUCTOR DEVICE

CROSS-REFERENCE TO RELATED APPLICATIONS

The disclosure of Japanese Patent Application No. 2015-082772 filed on Apr. 14, 2015 including the specification, drawings, and abstract is incorporated herein by reference in its entirety.

BACKGROUND

The present invention relates to a current detection method of a semiconductor device, and the semiconductor device. For example, the present invention relates to a semiconductor device which supplies power to a load and detects a current flowing through the load, and a current detection method for the same.

Patent Literature 1, for example, discloses a load-current detection circuit device which is comprised of a power MOSFET, a sense MOSFET, a resistor MOSFET, and a differential amplifier. The gate and drain of the sense MOSFET are coupled to the gate and drain of the power MOSFET, respectively. A source-to-drain path of the resistor MOSFET is coupled between a source of the sense MOSFET and a terminal for coupling an external measurement resistor. The inputs of the differential amplifier are coupled to the sources of the power MOSFET and the sense MOSFET, to control a gate of the resistor MOSFET.

PATENT LITERATURE (Patent Literature 1) Japanese Unexamined Patent Application Publication No. Hei 8 (1996)-334534.

SUMMARY

In the fields of power electronics as typified by a vehicle, it is necessary to supply power to loads such as a motor, and at the same time to detect a current flowing through the load with a high degree of accuracy. In such a case, it is possible to employ a circuit device as disclosed by Patent Literature 1. However, it is likely that the circuit device cannot achieve the highly precise current detection, due to the manufacturing variations of each circuit element or due to the temperature dependence of each circuit element.

The present invention to be described in the following embodiments has been accomplished in view of the above, and the other issues and new features of the present invention will become clear from the description of the present specification and the accompanying drawings.

A current detection method of a semiconductor device according to one embodiment is applied to a semiconductor device in which a first semiconductor chip and a second semiconductor chip are mounted in one package. The first semiconductor chip is provided with an electric power supply transistor which supplies power to a load via a load driving terminal, and a current detection circuit which detects a current flowing through the load driving terminal. In the inspection process of the semiconductor device, the electrical property of the current detection circuit in the first semiconductor chip is inspected, and the information on a correction equation obtained on the basis of the inspection result is written in a memory circuit of the second semiconductor chip. The second semiconductor chip corrects the detection result obtained by the current detection circuit on the basis of the information on the correction equation written in the memory circuit.

According to the one embodiment, it is possible to provide a semiconductor device provided with the highly precise current detecting function.

DETAILED DESCRIPTION

Figure 1:
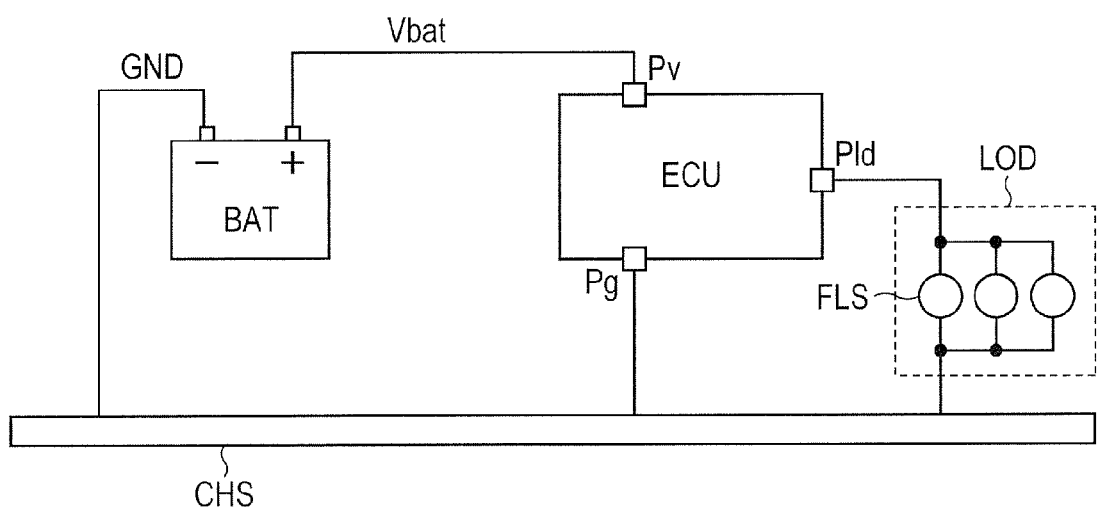
FIG. 1 is a schematic diagram illustrating an example of the configuration of a part of a vehicle device to which a semiconductor device according to Embodiment 1 of the present invention is applied.

In the following embodiments, the explanation will be made for several divided sections or embodiments when it is necessary for convenience. However, except when specified clearly in particular, the divided sections or embodiments are not mutually unrelated; however, one is regarded as a modified example, details, or a supplementary explanation of some or all of the others. When the number of elements (including the number, a numerical value, an amount, a range) are referred to in the following embodiment, it is not always restricted to the specific number of elements but it may be more or less than the specific number, except when it is specified clearly and when it is theoretically and clearly restricted to a specific number.

In the following embodiment, it is needless to say that the component (including an element step) is not necessarily indispensable except when it is specified clearly and when it is theoretically thought that it is clearly indispensable. Similarly, in the following embodiment, when describing the form, positional relationship, etc., of a component for example, what resembles to or is substantially similar to the form, etc. shall be included, except when it is clearly specified and when it is considered theoretically that it is not so. Same applies to the numerical value and the range.

Although not restricted in particular, a circuit element that configures each functional block of the embodiments is formed over a semiconductor substrate such as single crystal silicon by employing the well-known CMOS (complementary MOS transistor) integrated circuits technology. In the embodiments, an MOSFET (Metal Oxide Semiconductor Field Effect Transistor) (abbreviated as an MOS transistor) is employed as an example of an MISFET (Metal Insulator Semiconductor Field Effect Transistor). However, it does not suggest the exclusion of a non-oxide film as a gate insulating film. Connection of a substrate potential of an MOS transistor is not indicated in particular in the drawings. However, the connection method is not restricted in particular as far as it enables a normal operation of the MOS transistor.

Hereinafter, the embodiment of the present invention is described in detail, with reference to the drawings. In the entire diagrams used to explain the embodiments of the present invention, the same symbol is attached to the same element in principle, and the repeated explanation thereof is omitted.

Embodiment 1

An Outline Configuration of a Vehicle Device

FIG. 1 is a schematic diagram illustrating an example of the configuration of a part of a vehicle device to which a semiconductor device according to Embodiment 1 of the present invention is applied. The vehicle device illustrated in FIG. 1 includes a chassis CHS, a battery BAT, an electronic control unit ECU, and a load LOD. The battery BAT generates a battery voltage Vbat of a prescribed value (typically 12V), with reference to a ground power supply voltage GND at the chassis CHS. The load LOD is comprised of three flashers FLS coupled in parallel in the present example. One end of each of the three flashers FLS is coupled to the ground power supply voltage GND. The three flashers FLS are attached, for example, to the left front part, the left rear part, and the left side part of the vehicle device, respectively.

The electronic control unit ECU includes three connector terminals Pv, Pg, and Pld. The battery voltage Vbat is supplied to the connector terminal Pv and the ground power supply voltage GND is supplied to the connector terminal Pg. Although the details will be described later, the electronic control unit ECU includes the semiconductor device according to Embodiment 1, and supplies power to the load LOD (the other end of each of the three flashers FLS) via the connector terminal Pld. Specifically, the electronic control unit ECU supplies power to the three flashers FLS when the vehicle device turns to the left for example, then the three flashers FLS flash together accordingly.

The Outline and Problem of the Electronic Control Unit (Premise)

Figure 18A:
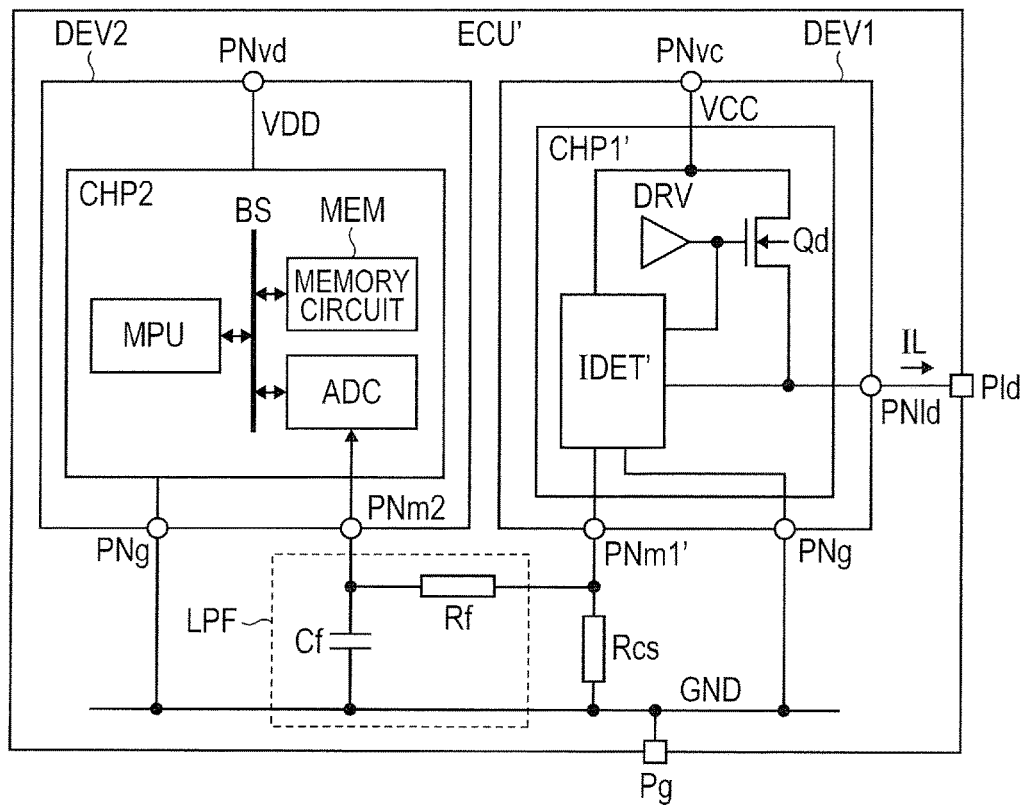
FIG. 18A is a circuit block diagram illustrating an example of the outline configuration of a principal part of an electronic control unit which includes the semiconductor device examined as a premise of the present invention.
Figure 18B:
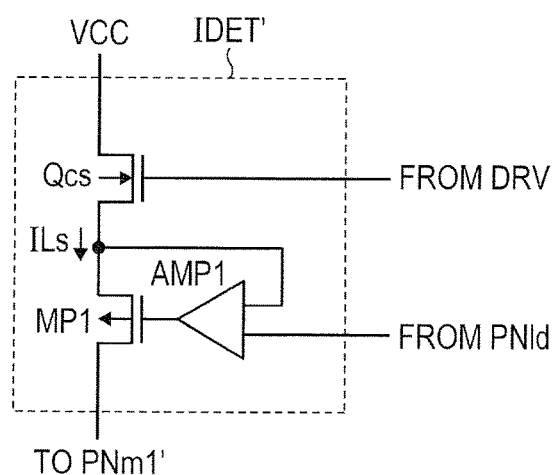
FIG. 18B is a circuit diagram illustrating an example of the configuration of a current detection circuit illustrated in FIG. 18A.

FIG. 18A is a circuit block diagram illustrating an example of the outline configuration of a principal part of an electronic control unit which includes the semiconductor device examined as a premise of the present invention. FIG. 18B is a circuit diagram illustrating an example of the configuration of a current detection circuit illustrated in FIG. 18A. The electronic control unit ECU' illustrated in FIG. 18A is comprised of a wiring substrate including the connector terminals Pv, Pg, and Pld (Pv is not shown) illustrated in FIG. 1, for example. The wiring substrate has on board two semiconductor devices (package components) DEV1 and DEV2, a current detection resistor Rcs, and a low pass filter circuit LPF comprised of an LPF capacitor Cf and an LPF resistor Rf.

The semiconductor device DEV1 includes external terminals PNvc, PNg, PNld, and PNm1' and has on board a semiconductor chip CHP1'. The semiconductor chip CHP1' includes an electric power supply transistor (here an nMOS transistor) Qd, a driver circuit DRV to drive the electric power supply transistor Qd, and a current detection circuit IDET'. A supply voltage VCC is supplied to the external terminal PNvc and the ground power supply voltage GND is supplied to the external terminal PNg. The supply voltage VCC is the battery voltage Vbat illustrated in FIG. 1, for example.

In the electric power supply transistor Qd, the drain is supplied with the supply voltage VCC and the source is coupled to the external terminal (load driving terminal) PNld. The external terminal PNld is coupled to the connector terminal Pld illustrated in FIG. 1 over the wiring substrate. The current detection circuit IDET' detects a load current IL flowing through the external terminal PNld (in other words, a current flowing through the load LOD or a current flowing through the electric power supply transistor Qd), and it is configured as illustrated in FIG. 18B, for example.

The current detection circuit IDET' illustrated in FIG. 18B includes a current detection transistor (here an nMOS transistor) Qcs, an MOS transistor (here a pMOS transistor) MP1, and an amplifier circuit AMP1. The current detection transistor Qcs is formed with a transistor size of a prescribed ratio relative to the electric power supply transistor Qd (although not restricted in particular, with a ratio of 1/1000 to 1/10000). The gate and drain of the current detection transistor Qcs are coupled to the gate and drain of the electric power supply transistor Qd, respectively.

In the MOS transistor MP1, the source is coupled to a source of the current detection transistor Qcs, and the drain is coupled to the external terminal PNm1'. The inputs of the amplifier circuit AMP1 are coupled with the source of the current detection transistor Qcs and the source of the electric power supply transistor Qd, to control the gate of the MOS transistor MP1 so as to make equal both source voltages. As a result, the current detection transistor Qcs is driven by the driver circuit DRV in parallel with the electric power supply transistor Qd, with an equal gate-to-source voltage.

According to this configuration, the current detection transistor Qcs flows a sense current (that is, a current based on the transistor size ratio) ILs through the source-to-drain, reflecting the load current IL flowing through the electric power supply transistor Qd. The current detection resistor Rcs is provided between the external terminal PNm1' and the ground power supply voltage GND (that is, the connector terminal Pg), and outputs to the external terminal PNm1' a voltage reflecting the sense current ILs flowing through the current detection transistor Qcs. The low pass filter circuit LPF smoothes the voltage outputted to the external terminal PNm1'.

The semiconductor device DEV2 includes external terminals PNvd, PNg, and PNm2 and has on board a semiconductor chip CHP2. A supply voltage VDD is supplied to the external terminal PNvd and the ground power supply voltage GND is supplied to the external terminal PNg. The supply voltage VDD is 3.3V or 5.0V, for example, and is generated by stepping down the battery voltage Vbat illustrated in FIG. 1.

The semiconductor chip CHP2 is a microcomputer, for example, and includes circuit blocks such as an arithmetic processing circuit MPU, a memory circuit MEM, and an analog-to-digital converter circuit ADC, and a bus BS to couple each of these circuit blocks mutually. The analog-to-digital converter circuit ADC converts into a digital signal the voltage (analog signal) inputted to the external terminal PNm2 via the low pass filter circuit LPF. According to the prescribed program held in the memory circuit MEM for example, the arithmetic processing circuit MPU processes the digital signal (in other words, the load current IL) outputted from the analog-to-digital converter circuit ADC, and performs various processing corresponding to the digital signal.

For example, when the electronic control unit ECU' is applied to the vehicle device of FIG. 1, the semiconductor device DEV2 issues instructions to the semiconductor device DEV1 via the prescribed external terminal (not shown) when the vehicle device turns to the left. The semiconductor device DEV1 receives the instructions at the prescribed external terminal (not shown), drives the electric power supply transistor Qd (and the current detection transistor Qcs) by using the driver circuit DRV, and supplies power to the load LOD (that is, three flashers FLS). In this case, the semiconductor device DEV2 detects the current value of the load current IL flowing through the three flashers FLS in parallel, via the external terminal PNm2.

Here, when one of three flashers FLS is out of order, the current value detected by the external terminal PNm2 becomes smaller than the reference current value which is known in advance. Usually, the flashers FLS at the left front part and the left rear part of the vehicle device are comprised of components of the same power consumption, and the flasher FLS at the left side part is comprised of components of the power consumption smaller than that of the flasher FLS at the left front part.

Accordingly, on the basis of the current value detected at the external terminal PNm2, it is possible for the semiconductor device DEV2 to distinguish the occurrence or non-occurrence of the failure in three flashers FLS, in addition, to distinguish the number of failures or the position of the failure (failure at the left front part or the left rear part, or failure at the left side part). However, for that purpose, detecting the load current IL to a high degree of accuracy is required. In particular, when the flasher FLS is comprised of an LED (Light Emitting Diode) for example, the power consumption becomes smaller. Accordingly, the accuracy enhancement of the current detection becomes more important.

Here, the case where the load LOD is the flasher FLS is exemplified. However, it is not restricted to the case in particular. For example, also in the case where the load LOD is a motor or an actuator, the accuracy enhancement of the current detection is important. When a motor is taken as an example, the semiconductor device DEV2 calculates a PWM (Pulse Width Modulation) duty for bringing the detected current close to a prescribed current, and directs it to the semiconductor device DEV1. The semiconductor device DEV1 drives the electric power supply transistor Qd with the directed PWM signal, and supplies a prescribed load current IL to the motor. In such a case, the more the accuracy enhancement of the current detection is attained, the more precisely the control of the rotational frequency of the motor can be performed.

To such a request, it is likely that the example of the configuration illustrated in FIG. 18A and FIG. 18B cannot fully attain the accuracy enhancement of the current detection. Specifically, the error factors include (A) manufacturing variations of the transistor size ratio of the current supply transistor Qd and the current detection transistor Qcs, (B) the offset voltage of the amplifier circuit AMP1, (C) variations of the value of resistance of the current detection resistor Rcs, and (D) the temperature dependence of (A)-(C) described above. In this way, since the error occurs complexly, countermeasures such as devices in a circuit and a layout may have a limit. Therefore, it becomes useful to employ a system according to Embodiment 1 described in the following.

A Configuration of a Semiconductor Device (Embodiment 1)

Figure 2A:
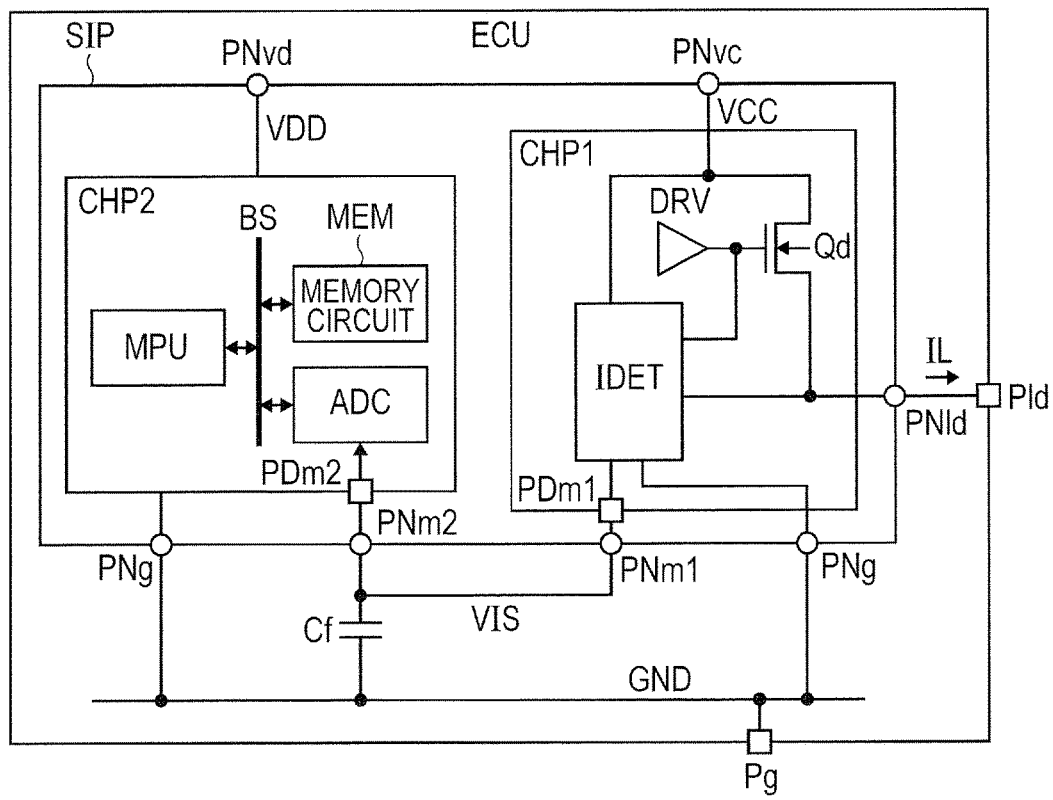
FIG. 2A is a circuit block diagram illustrating an example of the outline configuration of a principal part of an electronic control unit which includes the semiconductor device according to Embodiment 1 of the present invention.
Figure 2B:
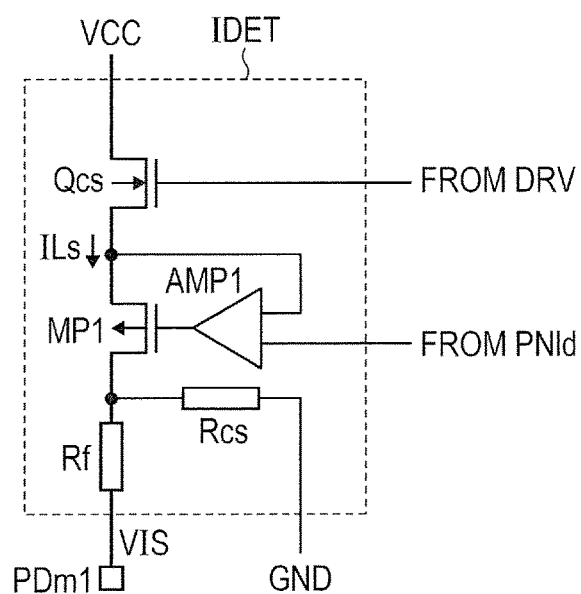
FIG. 2B is a circuit diagram illustrating an example of the configuration of a current detection circuit in FIG. 2A.

FIG. 2A is a circuit block diagram illustrating an example of the outline configuration of a principal part of an electronic control unit which includes the semiconductor device according to Embodiment 1 of the present invention, and FIG. 2B is a circuit diagram illustrating an example of the configuration of a current detection circuit in FIG. 2A. The electronic control unit ECU illustrated in FIG. 2A is comprised of a wiring substrate including the connector terminals Pv, Pg, and Pld (Pv is not shown) illustrated in FIG. 1, for example. Unlike the case of FIG. 18A, the wiring substrate has on board a semiconductor device (package component) SIP and an LPF capacitor Cf.

The semiconductor device SIP includes external terminals PNvc, PNvd, PNg, PNld, PNm1, and PNm2, and has on board two semiconductor chips CHP1 and CHP2. As is the case with FIG. 18A, the supply voltages VCC and VDD are supplied to the external terminals PNvc and PNvd, respectively, and the ground power supply voltage GND is supplied to the external terminal PNg. In addition to the electric power supply transistor Qd and the driver circuit DRV as in the semiconductor chip CHP1' illustrated in FIG. 18A, the semiconductor chip CHP1 includes an electrode pad (terminal) PDm1 and a current detection circuit IDET which is different from the one illustrated in FIG. 18A. Although not shown in the drawing, the semiconductor chip CHP1 further includes various protection circuits which detect an overvoltage and an overcurrent and stop the electric power supply.

As illustrated in FIG. 2B, the current detection circuit IDET includes a current detection resistor Rcs and an LPF resistor Rf, in addition to the current detection transistor Qcs, the MOS transistor MP1, and the amplifier circuit AMP1 as is the case with the current detection circuit IDET' illustrated in FIG. 18B. That is, in FIG. 18A, the current detection resistor Rcs and the LPF resistor Rf are provided outside the semiconductor device; however, in FIG. 2A and FIG. 2B, they are provided inside the semiconductor chip CHP1 of the semiconductor device SIP.

The current detection resistor Rcs is coupled to the current detection transistor Qcs in series via the MOS transistor MP1. Specifically, one end of the current detection resistor Rcs is coupled to the drain of the MOS transistor MP1, and the other end is coupled to the ground power supply voltage GND (that is, the external terminal PNg). An LPF resistor Rf is provided between one end of the current detection resistor Rcs (the drain of the MOS transistor MP1), and the electrode pad (terminal) PDm1. The electrode pad PDm1 is coupled to the external terminal (the current monitor terminal) PNm1. To the external terminal PNm1, the LPF capacitor Cf can be coupled in the exterior of the semiconductor device SIP, for example.

As a result, a voltage (referred to as a current monitor signal VIS) which reflects a load current IL flowing through the external terminal (load driving terminal) PNld is outputted to the electrode pad (terminal) PDm1 and the external terminal PNm1, as is the case with FIG. 18A and FIG. 18B. The current monitor signal VIS is smoothed by the low pass filter circuit LPF, and is equivalent to the signal at the external terminal PNm2 of FIG. 18A. Although not restricted in particular, the current detection resistor Rcs and the LPF resistor Rf are formed with a polysilicon layer or a diffusion layer over the silicon substrate.

The semiconductor chip CHP2 is a microcomputer, for example, and as is the case with FIG. 18A, it includes circuit blocks such as an arithmetic processing circuit MPU, a memory circuit MEM, and an analog-to-digital converter circuit ADC, and a bus BS to couple each of these circuit blocks mutually. Here, the semiconductor chip CHP2 also includes an electrode pad (terminal) PDm2. The electrode pad PDm2 is coupled to the external terminal PNm2.

The electrode pad PDm2 is a terminal for coupling to the electrode pad (terminal) PDm1 of the semiconductor chip CHP1. In the example of FIG. 2A, the external terminal PNm1 and the external terminal PNm2 are coupled together over the wiring substrate of the electronic control unit ECU. Consequently, the electrode pad PDm2 is coupled to the electrode pad PDm1 via the external terminals PNm2 and PNm1. The analog-to-digital converter circuit ADC converts into a digital signal the current monitor signal VIS (analog signal) inputted into the electrode pad (terminal) PDm2.

Although the details will be described later, in Embodiment 1, the memory circuit MEM of the semiconductor chip CHP2 holds information on a correction equation obtained in the inspection process of the semiconductor device SIP. Then, the arithmetic processing circuit MPU of the semiconductor chip CHP2 corrects the digital signal outputted by the analog-to-digital converter circuit ADC by making use of the correction equation based on the information held in the memory circuit MEM, and calculates the current value of the load current IL which flows through the external terminal (load driving terminal) PNld.

A Current Detection Method of a Semiconductor Device (Embodiment 1)

Figure 3:
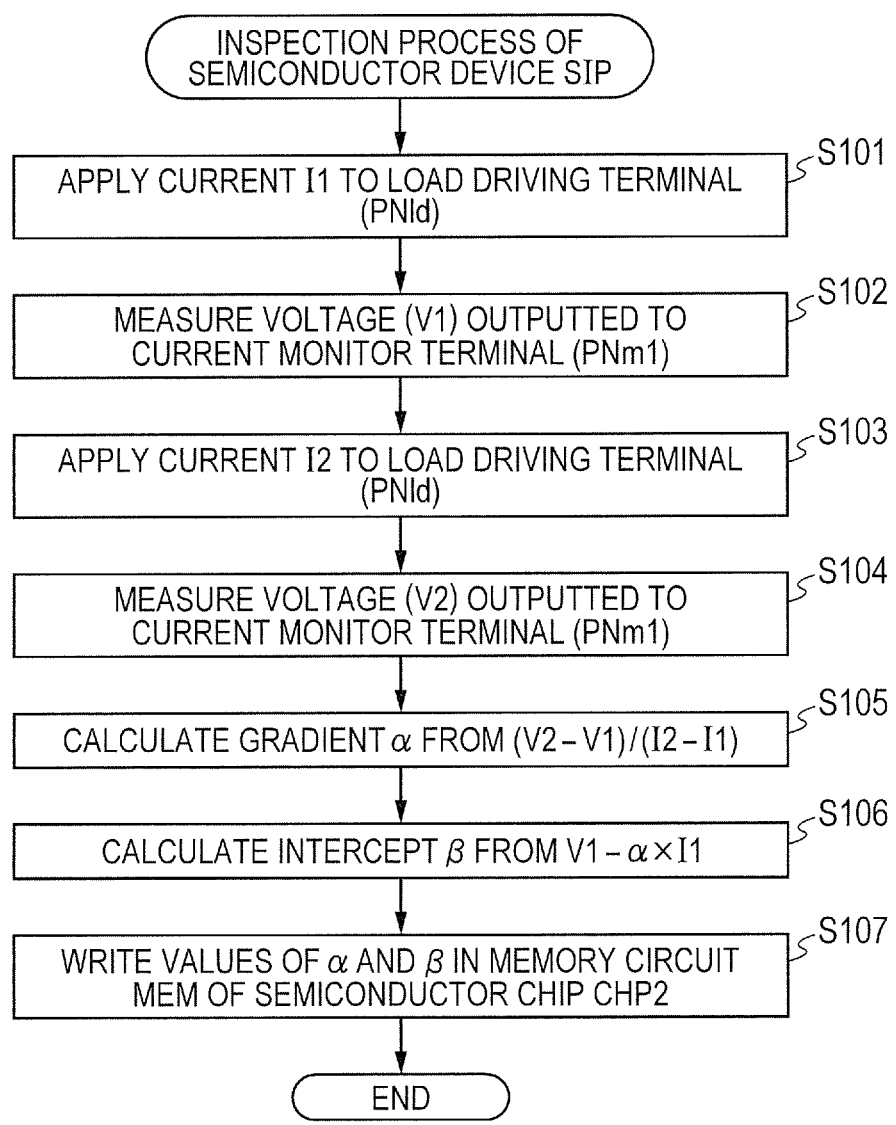
FIG. 3 is a flow chart illustrating an example of an inspection process in the semiconductor device illustrated in FIG. 2A and FIG. 2B.
Figure 4:
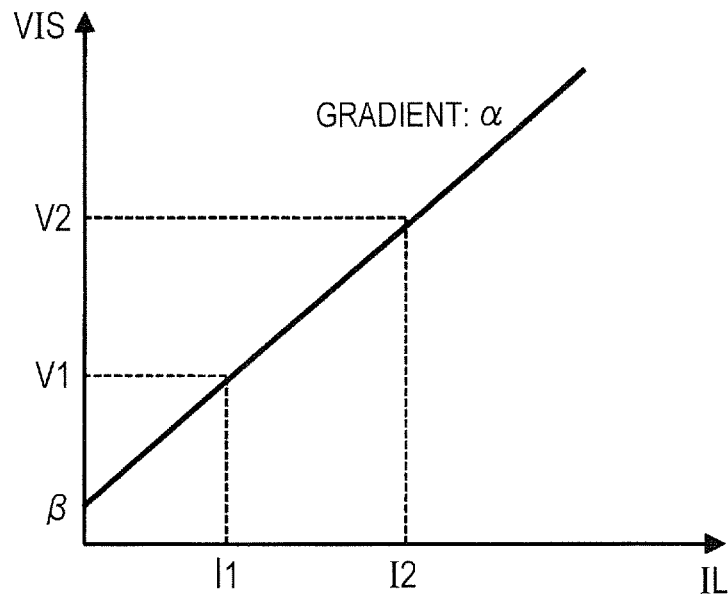
FIG. 4 is a supplementary drawing of FIG. 3.

FIG. 3 is a flow chart illustrating an example of an inspection process in the semiconductor device illustrated in FIG. 2A and FIG. 2B. FIG. 4 is a supplementary drawing of FIG. 3. First, as illustrated in FIG. 4, when the current detection circuit IDET illustrated in FIG. 2B is employed, the relation between the load current IL flowing through the load driving terminal PNld and the voltage (the current monitor signal VIS) outputted to the current monitor terminal PNm1 is expressed by a linear function defined by "VIS=$\alpha \times$IL+$\beta$" in principle.

However, the coefficients of the linear function (that is, a gradient $\alpha$ and an intercept $\beta$) vary depending on the error factors (A)-(C) as described in FIG. 18A and FIG. 18B. Accordingly, in Embodiment 1, the gradient $\alpha$ and the intercept $\beta$ are defined on the basis of the measured value (specifically inspection result of the electrical property of the current detection circuit IDET) in the inspection process of the semiconductor device SIP, and the gradient $\alpha$ and the intercept $\beta$ are written in the memory circuit MEM as the information on a correction equation. Then, the semiconductor chip calculates the current value of the load current IL from the current monitor signal VIS on the basis of the correction equation defined by "VIS=$\alpha \times$IL+$\beta$."

As illustrated in FIG. 3, first, in the state where the semiconductor chip CHP1 is kept operating (that is, in the state where the driver circuit DRV drives the electric power supply transistor Qd to ON), the prescribed inspection device applies a current I1 to the external terminal (load driving terminal) PNld of the semiconductor device SIP (Step S101). Subsequently, the inspection device measures a voltage V1 outputted to the electrode pad (terminal) PDm1 of the semiconductor chip CHP1 (actually the external terminal (current monitor terminal) PNm1 of the semiconductor device SIP) (Step S102).

Subsequently, in a similar way, in the state where the semiconductor chip CHP1 is kept operating, the inspection device applies a current I2 different from the current I1 to the load driving terminal PNld, and measures a voltage V2 outputted to the electrode pad (terminal) PDm1 (the current monitor terminal PNm1) (Steps S103 and S104). Subsequently, the inspection device defines the information on the correction equation on the basis of the relation between the difference between the current I1 and the current I2 and the difference between the voltage V1 and the voltage V2.

Specifically, as illustrated in FIG. 4, the inspection device calculates the gradient $\alpha$ from "(V2−V1)/(I2−I1)" (Step S105), calculates the intercept $\beta$ from "V1−$\alpha \times$I1" (Step S106), and defines the values of the gradient $\alpha$ and the intercept $\beta$ as the information on the correction equation. Then, the inspection device writes the defined information on the correction equation (in the present case, the coefficients of the linear function (values of the gradient $\alpha$ and the intercept β)) in the memory circuit MEM of the semiconductor chip CHP2 (Step S107).

Figure 5:
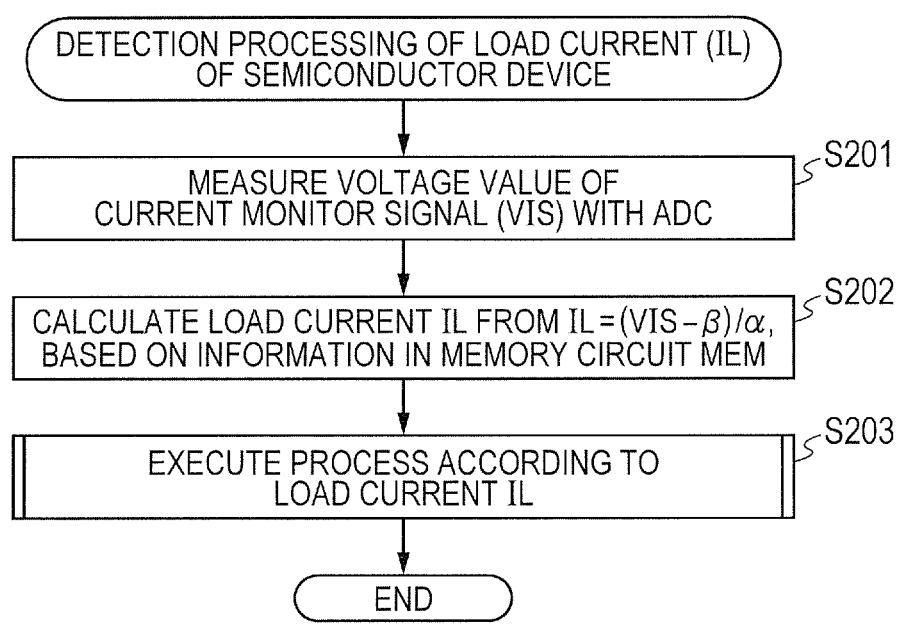
FIG. 5 is a flow chart illustrating an example of contents of processing in detecting a load current in the semiconductor device illustrated in FIG. 2A and FIG. 2B.

FIG. 5 is a flow chart illustrating an example of contents of processing in detecting a load current in the semiconductor device illustrated in FIG. 2A and FIG. 2B. The semiconductor device SIP supplies power to the load LOD, and performs a process as illustrated in FIG. 5 when detecting the load current IL. Specifically, for example, the arithmetic processing circuit MPU in the semiconductor chip CHP2 performs a process as illustrated in FIG. 5 according to the prescribed program held in the memory circuit MEM. As illustrated in FIG. 5, first, the arithmetic processing circuit MPU measures the voltage value of the current monitor signal VIS at the external terminal PNm2, with the analog-to-digital converter circuit ADC (Step S201).

Subsequently, the arithmetic processing circuit MPU defines the correction equation "VIS=α×IL+β (IL=(VIS−β)/α)" on the basis of the information held in the memory circuit MEM (the values of the gradient α and the intercept β). Then, the arithmetic processing circuit MPU corrects the digital signal (that is, the current monitor signal VIS) outputted from the analog-to-digital converter circuit ADC using the correction equation. Specifically, the arithmetic processing circuit MPU only substitute the value of the digital signal (VIS) to the correction equation. Accordingly, the arithmetic processing circuit MPU calculates the current value of the load current IL which flows through the load driving terminal PNld (Step S202).

Subsequently, the arithmetic processing circuit MPU executes the prescribed process according to the calculated current value (Step S203). For example, when the load LOD is the flasher FLS as described in FIG. 1, the arithmetic processing circuit MPU distinguishes the occurrence or non-occurrence of failure of the flasher FLS on the basis of the calculated current value. Alternatively, when the load LOD is a motor, the arithmetic processing circuit MPU defines a PWM duty on the basis of the calculated current value.

Main Effects of Embodiment 1

As described above, a complex error factor described in FIG. 18A and FIG. 18B can be collectively corrected by employing the system of Embodiment 1. Specifically, it is possible to correct the following error factors: (A) manufacturing variations in the transistor size ratio of the current supply transistor Qd and the current detection transistor Qcs; (B) the offset voltage of the amplifier circuit AMP1; and (C) variations in the value of resistance of the current detection resistor Rcs. As a result, it becomes possible to provide typically the semiconductor device SIP provided with the highly precise current detecting function.

Here, an electronic control unit ECU is generally manufactured by an electro-component assembly company. That is, an electro-component assembly company manufactures an electronic control unit ECU by implementing properly, over a wiring substrate, a semiconductor device SIP and other parts which are provided from an electro-component supply company. Under the circumstances, as compared with the electronic control unit ECU' illustrated in FIG. 18A, the electronic control unit ECU illustrated in FIG. 2A requires the less number of parts to be implemented on board. As a result, it is possible to realize the miniaturization of the electronic control unit ECU and the cost reduction including the assembly cost of components, from the viewpoint of the electro-component assembly company, for example.

Furthermore, by employing the example of the configuration illustrated in FIG. 2A, it is possible, in some cases, to reduce the burden of the electro-component assembly company in the viewpoint of the accuracy enhancement of the current detection, as compared with the case where the example of the configuration illustrated in FIG. 18A is employed. That is, depending on circumstances, it is possible to realize the accuracy enhancement of the current detection, provided that the electro-component assembly company conducts an inspection similar to the case of FIG. 3 for the electronic control unit ECU' illustrated in FIG. 18A. However, in this case, the object of inspection is not a semiconductor device but the electronic control unit ECU'; accordingly, there are cases where large-scale inspection facilities are required or a special inspection device is required. As a result, it is likely that a heavy burden is imposed on the side of the electro-component assembly company.

On the other hand, in the system of Embodiment 1, the object of inspection is the semiconductor device SIP; therefore, it is possible to conduct the inspection illustrated in FIG. 3 with the use of comparatively small-scale inspection facilities and the existing inspection device. Here, the object of inspection can be set to the semiconductor device SIP because the semiconductor device SIP illustrated in FIG. 2A has the current detection resistor Rcs built in the semiconductor device SIP, unlike the case of FIG. 18A. As a result, the semiconductor device SIP which is equipped with the highly precise current detecting function provided in advance can be supplied to the electro-component assembly company. Accordingly, it is possible to reduce the burden on the electro-component assembly company.

When the system of Embodiment 1 is employed, it is possible to attain the increase in efficiency of the inspection and the increase in efficiency of components, when the process up to the manufacture of the electronic control unit is observed as a whole as described above. Accordingly, it is possible not only to bring out the merit of the electro-component assembly company but also to reduce the total cost of the electronic control unit.

Moreover, the current detection resistor Rcs is comprised of the built-in resistor of the semiconductor chip CHP1 in the present case. However, depending on circumstances, the current detection resistor Rcs may be comprised of a general chip resistor. That is, it is also possible to have on board the chip resistor inside the semiconductor device SIP and outside the semiconductor chips CHP1 and CHP2. The chip resistor is usually highly precise when compared with the built-in resistor of a semiconductor chip. Accordingly, under the premise that no correction is performed, it can contribute to the accuracy enhancement of the current detection. However, when employing the system of Embodiment 1, it is possible to perform the correction including the error of the current detection resistor Rcs. Accordingly, there arises no problem even if the built-in resistor of a semiconductor chip is employed. By employing the built-in resistor of a semiconductor chip, it is possible to realize the miniaturization and cost reduction of the semiconductor device SIP, from the viewpoint of the electro-component supply company.

In Embodiment 1, it is assumed that the information on the correction equation held in the memory circuit MEM is the coefficients of the linear function; however, the information is not necessarily restricted to this. For example, it is also preferable that the relation between the voltage value of plural current monitor signals VIS and the current value of plural load currents IL is calculated in advance on the basis of the correction equation, and that the table including the relation may be defined as the information on the correction equation. That is, it is preferable that the correction equation is configured with the use of the table. In this case, the arithmetic processing circuit MPU refers to the table and acquires the current value of the load current IL. Moreover, the linear function is employed as the correction equation; however, the correction equation is not necessarily restricted to this, but it is also preferable to employ an approximate function with the order greater than the first order, for example. In this case, it is sufficient to perform the inspection by applying three or more kinds of currents, in an analogous manner to the case of FIG. 3.

Embodiment 2

A Configuration of a Semiconductor Device (Embodiment 2)

Figure 6:
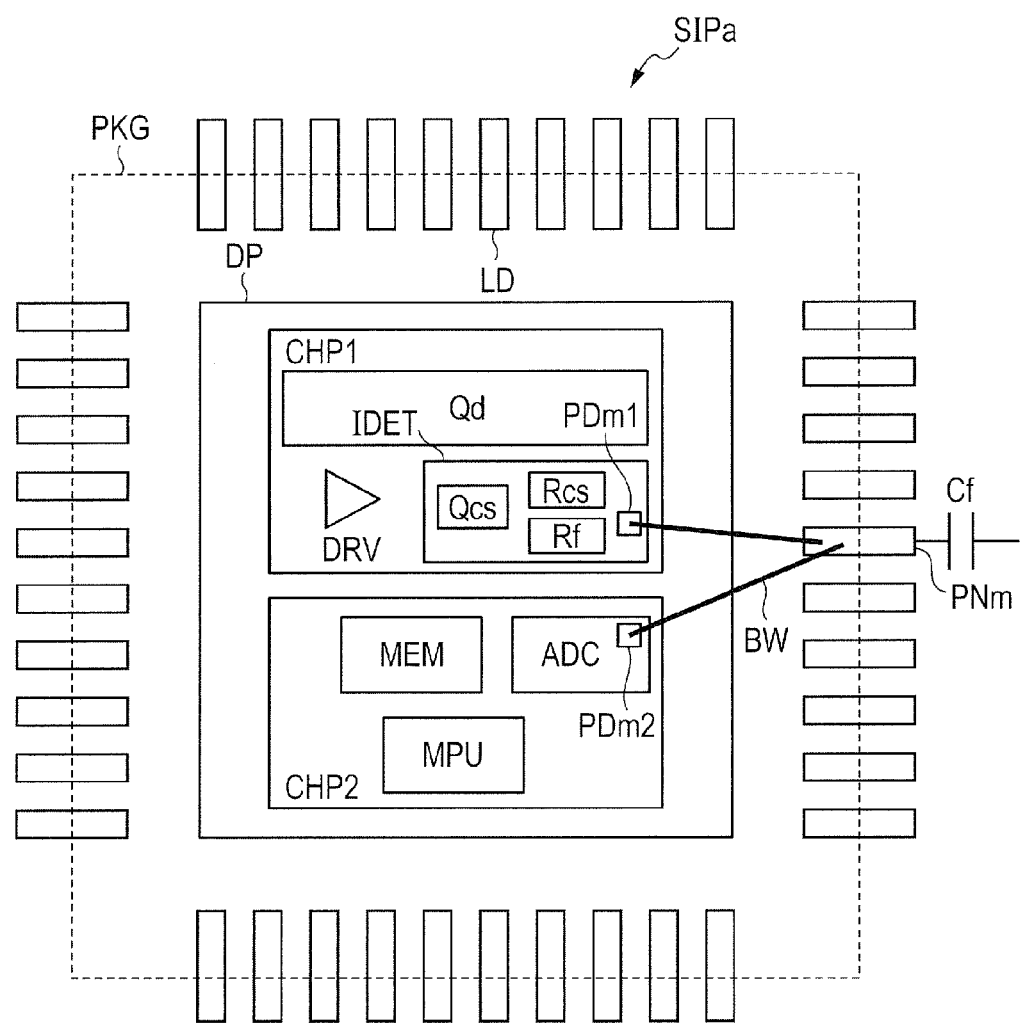
FIG. 6 is a plan view illustrating an example of a rough appearance of the principal part of a semiconductor device according to Embodiment 2 of the present invention.

FIG. 6 is a plan view illustrating an example of a rough appearance of the principal part of a semiconductor device according to Embodiment 2 of the present invention. As described in FIG. 2A, a semiconductor device SIPa illustrated in FIG. 6 is a package component in which the two semiconductor chips CHP1 and CHP2 are mounted in one package. In FIG. 6, a die pad DP is provided inside a package (package resin) PKG, and plural leads LD used as external terminals are provided in the outer peripheral part of the package PKG. Two semiconductor chips CHP1 and CHP2 are implemented over the die pad DP.

Here, unlike the semiconductor device SIP illustrated in FIG. 2A, in the semiconductor device SIPa illustrated in FIG. 6, the wiring is provided inside the package PKG in order to couple the electrode pad PDm1 of the semiconductor chip CHP1 and the electrode pad PDm2 of the semiconductor chip CHP2. In the present example, the electrode pads PDm1 and PDm2 are coupled to the same lead LD (here an external terminal (current monitor terminal) PNm) through a bonding wire BW, respectively. An LPF capacitor Cf is coupled to the current monitor terminal PNm.

Figure 7:
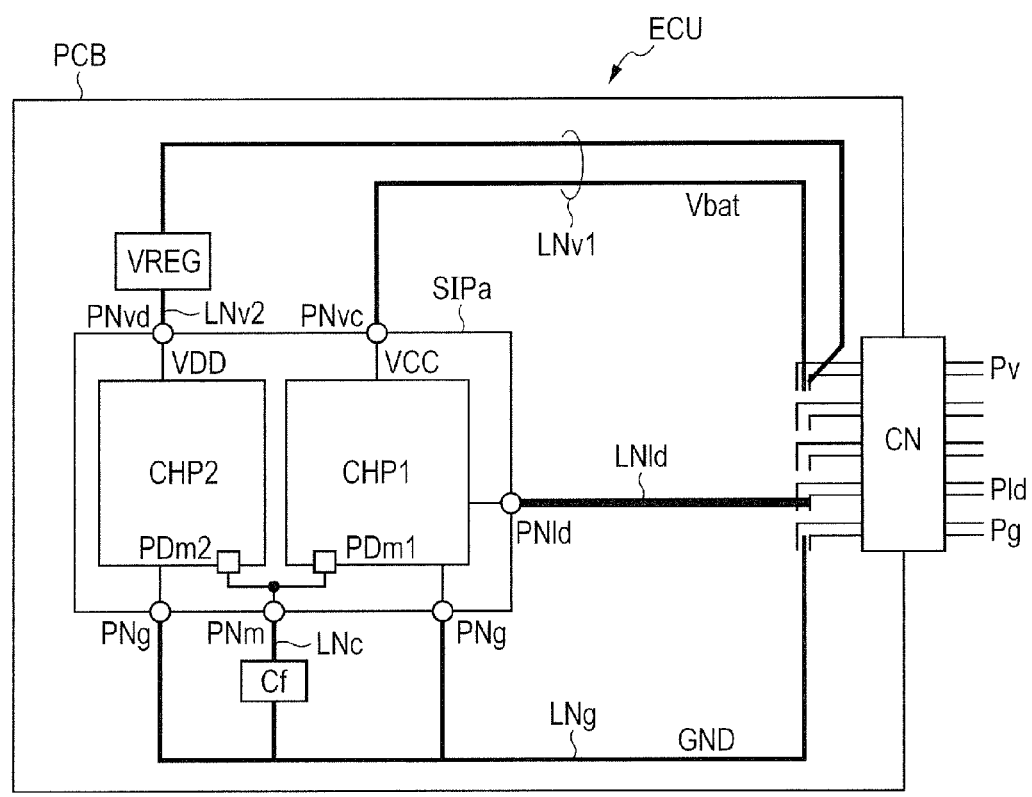
FIG. 7 is a circuit block diagram illustrating an example of the outline configuration of a principal part of an electronic control unit which includes the semiconductor device illustrated in FIG. 6.

FIG. 7 is a circuit block diagram illustrating an example of the outline configuration of a principal part of an electronic control unit which includes the semiconductor device illustrated in FIG. 6. The electronic control unit ECU illustrated in FIG. 7 is comprised of a wiring substrate PCB to which a connector CN is provided. The connector CN includes the connector terminals Pv, Pg, and Pld illustrated in FIG. 1. The wiring substrate PCB has on board one semiconductor device (package component) SIPa and an LPF capacitor Cf as is the case with FIG. 2A, and a power regulator device VREG additionally.

Over the wiring substrate PCB, a wiring LNv1 for the battery voltage Vbat, a wiring LNv2 for the supply voltage VDD, a wiring LNld for the load drive, a wiring LNg for the ground power supply voltage GND, and a wiring LNc for the LPF capacitor Cf are formed. One end of the wiring LNv1 is coupled to the connector terminal Pv, and the other end is coupled to the external terminal PNvc of the semiconductor device SIPa and the power regulator device VREG. The power regulator device VREG steps down the battery voltage Vbat (for example, 12V) supplied via the wiring LNv1 to the supply voltage VDD of 3.3V. Then, the power regulator device VREG supplies the supply voltage VDD to the external terminal PNvd of the semiconductor device SIPa via the wiring LNv2.

One end of the wiring LNld is coupled to the connector terminal Pld, and the other end is coupled to the external terminal (load driving terminal) PNld of the semiconductor device SIPa. One end of the wiring LNg is coupled to the connector terminal Pg, and the other end is coupled to the external terminal PNg of the semiconductor device SIPa and one end of the LPF capacitor Cf. The other end of the LPF capacitor Cf is coupled to the external terminal (current monitor terminal) PNm of the semiconductor device SIPa via the wiring LNc.

As described above, when the semiconductor device according to Embodiment 2 is employed, the electrode pads PDm1 and PDm2 are coupled inside the semiconductor device SIPa as illustrated in FIG. 6, in contrast to FIG. 2A in which they are coupled outside the semiconductor device SIP. Accordingly, it is possible to consolidate two external terminals PNm1 and PNm2 in FIG. 2A to one external terminal PNm in FIG. 6, contributing to the reduction in number of the external terminals. Furthermore, accompanying this reduction, a wiring to couple the two pieces of the external terminals PNm1 and PNm2 becomes unnecessary in the electronic control unit ECU illustrated in FIG. 7, and it becomes possible to reduce the assembly cost in the electro-component assembly company.

However, in the case of FIG. 6, the analog-to-digital converter circuit ADC in the semiconductor chip CHP2 which performs current detection is always specified. That is, usually the semiconductor chip CHP (for example, a microcomputer) is provided with several analog-to-digital converter circuits; however, it becomes difficult for the electro-component assembly company to specify arbitrarily one of the several analog-to-digital converter circuits to perform the current detection. Accordingly, there are cases where the configuration of FIG. 2A is more desirable.

Moreover, the LPF capacitor Cf is large in size generally; accordingly, it is mounted outside the semiconductor device SIPa as an external part in Embodiment 2. However, depending on circumstances, it is also possible to mount the LPF capacitor Cf inside the semiconductor device SIPa. In this case, the external terminal PNm illustrated in FIG. 6 and FIG. 7 can be deleted.

Embodiment 3

A Configuration of a Semiconductor Device (Embodiment 3)

Figure 8A:
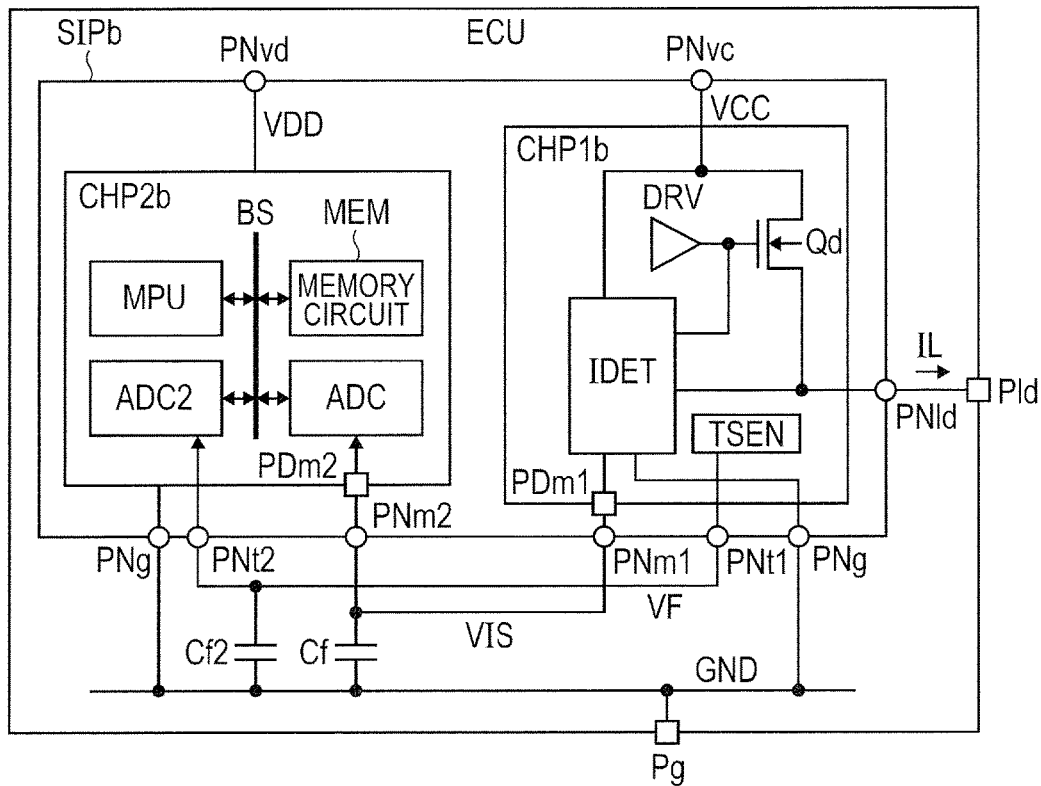
FIG. 8A is a circuit block diagram illustrating an example of the outline configuration of a principal part of an electronic control unit which includes a semiconductor device according to Embodiment 3 of the present invention.
Figure 8B:
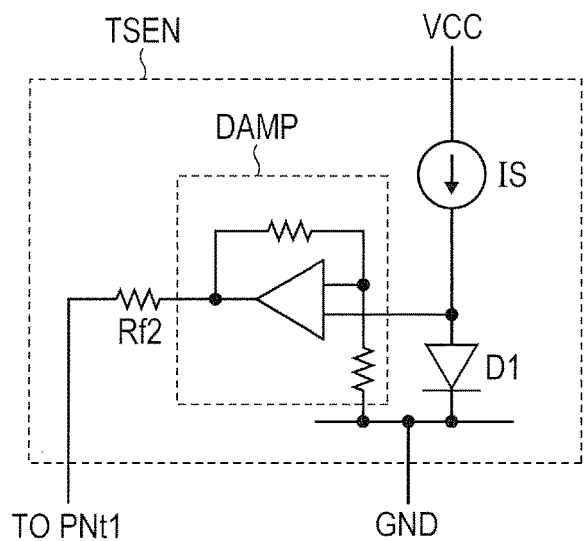
FIG. 8B is a circuit diagram illustrating an example of the configuration of a temperature sensor circuit in FIG. 8A.

FIG. 8A is a circuit block diagram illustrating an example of the outline configuration of a principal part of an electronic control unit which includes a semiconductor device according to Embodiment 3 of the present invention. FIG. 8B is a circuit diagram illustrating an example of the configuration of a temperature sensor circuit in FIG. 8A. The electronic control unit ECU illustrated in FIG. 8A is mainly different from the example of the configuration illustrated in FIG. 2, in the configuration of the semiconductor device SIPb and that an LPF capacitor Cf2 is newly included.

The semiconductor device SIPb illustrated in FIG. 8A includes external terminals PNt1 and PNt2, in addition to the external terminals PNvc, PNvd, PNg, PNld, PNm1, and PNm2, illustrated in FIG. 2A. One end of the LPF capacitor Cf2 is coupled to the external terminals PNt1 and PNt2. The other end of the LPF capacitor Cf2 is supplied with the ground power supply voltage GND.

Moreover, the semiconductor chip CHP1$b$ illustrated in FIG. 8A further includes a temperature sensor circuit TSEN in comparison to the semiconductor chip CHP1 illustrated in FIG. 2A. The semiconductor chip CHP2$b$ illustrated in FIG. 8A further includes an analog-to-digital converter circuit ADC2 coupled to a bus BS, in comparison to the semiconductor chip CHP2 illustrated in FIG. 2A.

The temperature sensor circuit TSEN outputs a temperature monitor signal VF with a value indicative of temperature. Specifically, as illustrated in FIG. 8B, the temperature sensor circuit TSEN includes a constant current source IS, a diode D1, a differential amplifier circuit DAMP, and an LPF resistor Rf2. The constant current source IS supplies a constant current to the diode D1. The diode D1 generates a forward voltage corresponding to the magnitude of the constant current. This forward voltage has negative temperature dependence, and becomes smaller as the temperature becomes higher.

The differential amplifier circuit DAMP amplifies the forward voltage of the diode D1, and outputs the amplified voltage as the temperature monitor signal VF, to the external terminal PNt1 via the LPF resistor Rf2. The LPF resistor Rf2 configures a low pass filter circuit together with the LPF capacitor Cf2 as is the case with FIG. 2A. As a result, the smoothed temperature monitor signal VF is inputted into the external terminal PNt2. The analog-to-digital converter circuit ADC2 converts into a digital signal the temperature monitor signal VF (analog signal) inputted into the external terminal PNt2. Note that the temperature sensor circuit TSEN is not restricted in particular to the configuration illustrated in FIG. 8B and that any circuit which outputs the temperature monitor signal VF with a value indicative of temperature can work.

In such a configuration, in Embodiment 3, the memory circuit MEM of the semiconductor chip CHP2$b$ holds the information on a correction equation including the temperature dependence obtained in the inspection process of the semiconductor device SIPb. Moreover, the arithmetic processing circuit MPU corrects the digital signal outputted from the analog-to-digital converter circuit ADC (that is, the current monitor signal VIS) by use of the correction equation corresponding to the temperature monitor signal VF (specifically, the digital signal outputted from the analog-to-digital converter circuit ADC2), and thereby calculates the current value of the load current IL flowing through the load driving terminal PNld.

A Current Detection Method of a Semiconductor Device (Embodiment 3)

Figure 9:
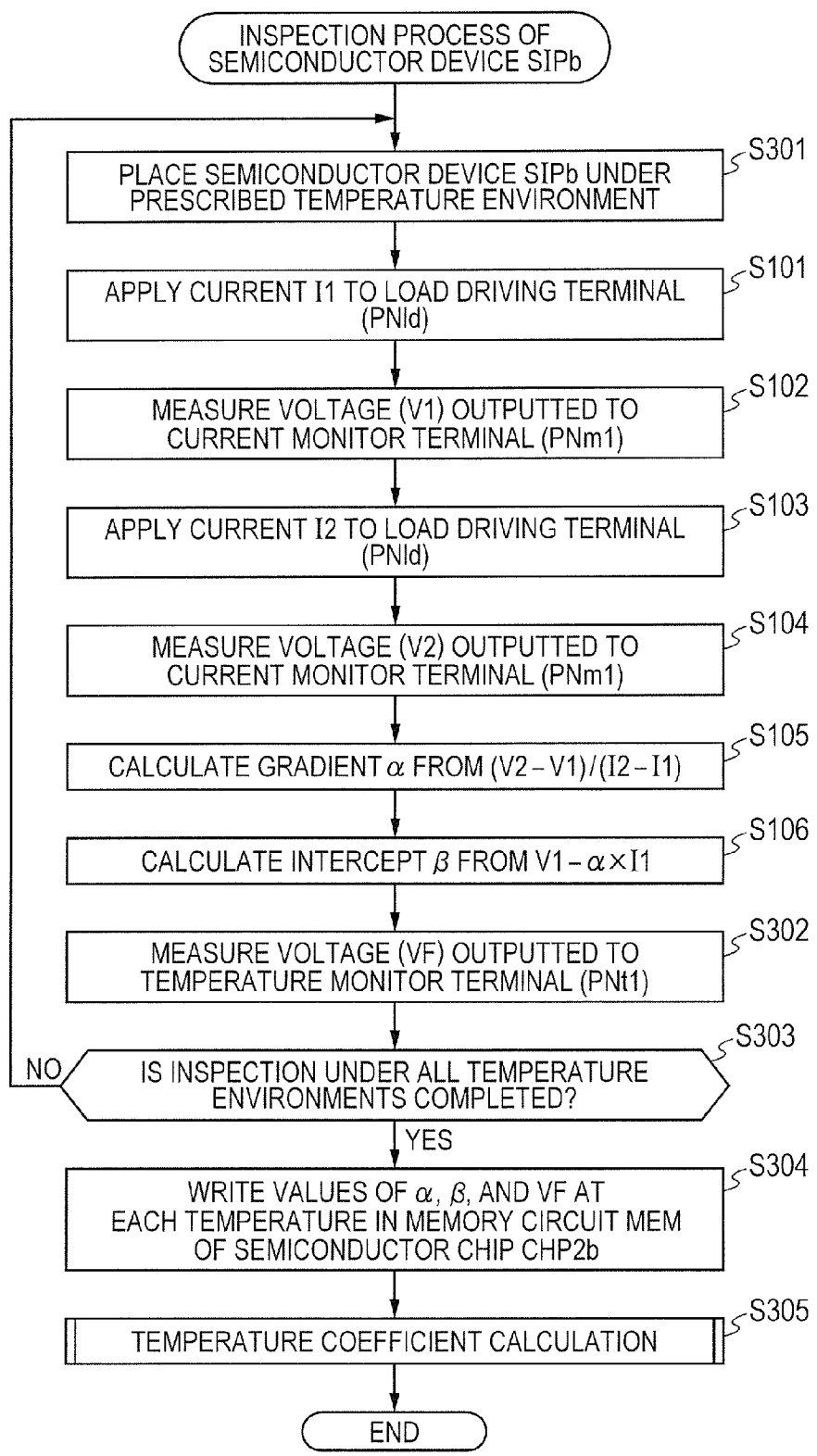
FIG. 9 is a flow chart illustrating an example of an inspection process in the semiconductor device illustrated in FIG. 8A and FIG. 8B.
Figures 10A, 10B:
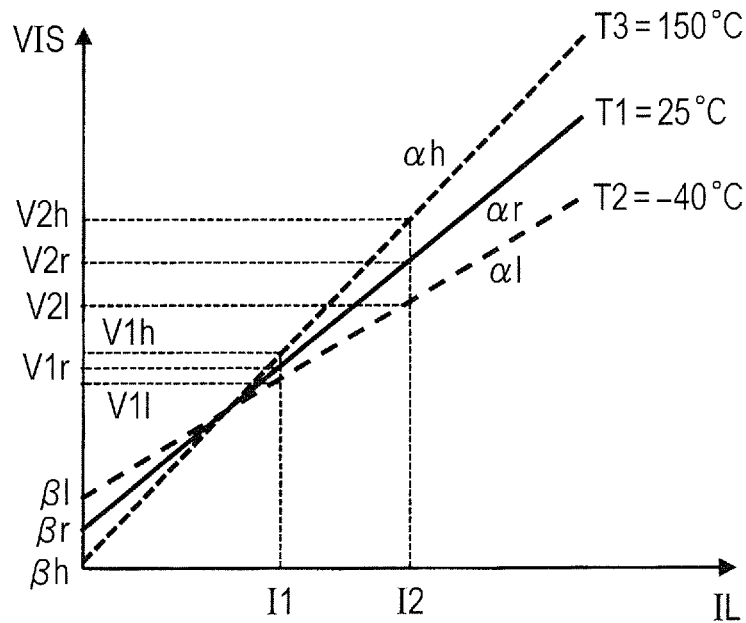
FIG. 10A and FIG. 10B are supplementary drawings of FIG. 9.

FIG. 9 is a flow chart illustrating an example of an inspection process in the semiconductor device illustrated in FIG. 8A and FIG. 8B. FIG. 10A and FIG. 10B are supplementary drawings of FIG. 9. First, in FIG. 10A, the relation between the load current IL flowing through the load driving terminal PNld and the voltage (the current monitor signal VIS) outputted to the current monitor terminal PNm1 is expressed by a linear function defined by "VIS=a×IL+p" in principle, as is the case with FIG. 4.

However, the coefficient (that is, a gradient α and an intercept β) of the linear function varies depending on the error factor (D) described in FIG. 18A and FIG. 18B (that is, the temperature dependence), in addition to the error factors (A)-(C) described in FIG. 4. In FIG. 10A, the gradient α becomes greater as the temperature becomes higher, and the intercept β becomes smaller as the temperature becomes higher, as an example. Accordingly, Embodiment 3 adopts a current detection method in which the gradient α, the intercept β, and the temperature dependence thereof are determined, on the basis of the measured value in the inspection process of the semiconductor device SIPb, and the current value of the load current IL is calculated from the current monitor signal VIS, by making use of the correction equation including the temperature dependence ("VIS=α× IL+β").

In FIG. 9, first, the prescribed inspection device including a temperature environment device places the semiconductor device SIPb under the environment of a prescribed temperature T1 (Step S301). Next, the inspection device executes Step S101-Step S106 which are described in FIG. 3, and measures further the voltage (that is, the temperature monitor signal VF) outputted to the external terminal (temperature monitor terminal) PNt1 (Step S302). Subsequently, the inspection device determines whether the inspection under all the temperature environments is completed (Step S303).

When the inspection under all the temperature environments is not completed, the inspection device returns to Step S301 and places the semiconductor device SIPb under the environment of a prescribed temperature T2. Then, the inspection device executes Step S101-Step S106, and measures further the voltage (the temperature monitor signal VF) outputted to the external terminal (temperature monitor terminal) PNt1 (Step S302). Hereinafter, the similar process is repeated until the inspection under all the temperature environments is completed.

Here, it is assumed that the inspection under the environment of T1=25° C., T2=-40° C., and T3=150° C. is conducted as an example. In this case, as illustrated in FIG. 10B, the gradient αr, the intercept βr, and the temperature monitor signal VFr are obtained, respectively, by the process of Steps S105, S106, and S302 performed under the 25° C. environment. Moreover, the gradient αl, the intercept βl, and the temperature monitor signal VFl are obtained, respectively, by the process of Steps S105, S106, and S302 performed under the −40° C. environment. Finally, the gradient ah, the intercept βh, and the temperature monitor signal VFh are obtained, respectively, by the process of Steps S105, S106, and S302 performed under the 150° C. environment.

When the inspection under all the temperature environments is completed at Step S303, the inspection device writes the gradients αr, αl, and αh, the intercepts βr, βl, and βh, and the temperature monitor signals VFr, VFl, and VFh for respective temperatures in the memory circuit MEM of the semiconductor chip CHP2$b$ (Step S304). Subsequently, the inspection device executes the temperature coefficient calculation (Step S305).

Figure 11:
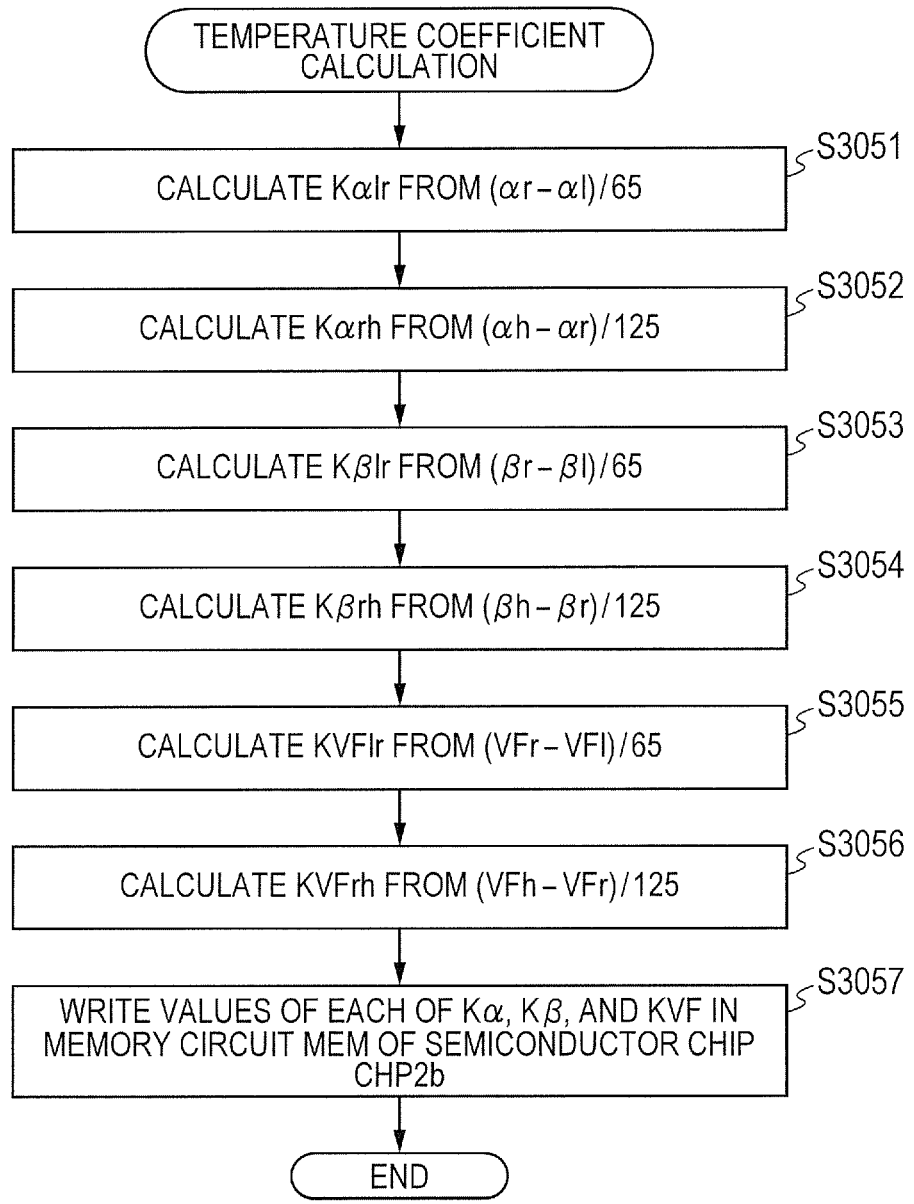
FIG. 11 is a flow chart illustrating an example of the contents of processing of the temperature coefficient calculation in FIG. 9.
Figure 12A:
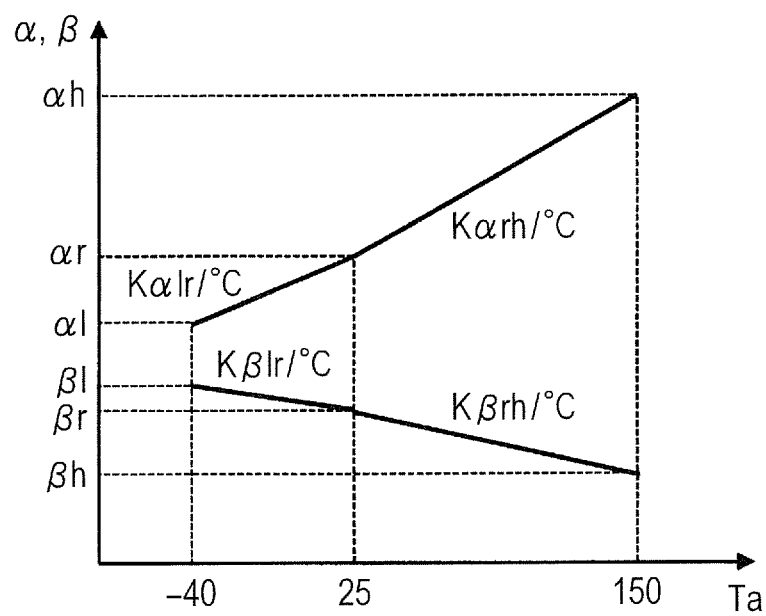
FIG. 12A and FIG. 12B are supplementary drawings of FIG. 11.
Figure 12B:
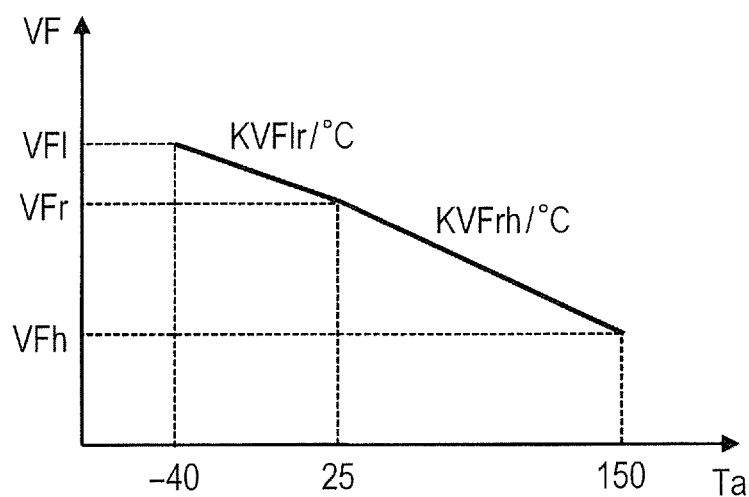

FIG. 11 is a flow chart illustrating an example of the contents of processing of the temperature coefficient calculation in FIG. 9. FIG. 12A and FIG. 12B are supplementary drawings of FIG. 11. FIG. 12A illustrates an example of the temperature characteristic of the gradient α and the intercept β. FIG. 12B illustrates an example of the temperature characteristic of the temperature monitor signal VF. In FIG. 11, the inspection device calculates a temperature coefficient Kαlr from (αr−αl)/65 (Step S3051) and a temperature coefficient Kαrh from (αh−ar)/125 (Step S3052). As illustrated in FIG. 12A, the temperature coefficient Kαlr expresses the temperature coefficient of the gradient α in the range from −40° C. to 25° C., and the temperature coefficient Kαrh expresses the temperature coefficient of the gradient α in the range from 25° C. to 150° C.

Similarly, in FIG. 11, the inspection device calculates a temperature coefficient Kβlr from (βr−βl)/65 (Step S3053) and a temperature coefficient Kβrh from (βh−βr)/125 (Step S3054). As illustrated in FIG. 12A, the temperature coefficient Kβlr expresses the temperature coefficient of the intercept β in the range from −40° C. to 25° C., and the temperature coefficient Kβrh expresses the temperature coefficient of the intercept β in the range from 25° C. to 150° C.

Furthermore in a similar manner, in FIG. 11, the inspection device calculates a temperature coefficient KVFlr from (VFr−VFl)/65 (Step S3055) and a temperature coefficient KVFrh from (VFh−VFr)/125 (Step S3056). As illustrated in FIG. 12B, the temperature coefficient KVFlr expresses the temperature coefficient of the temperature monitor signal VF in the range from −40° C. to 25° C., and the temperature coefficient KVFrh expresses the temperature coefficient of the temperature monitor signal VF in the range from 25° C. to 150° C. Then, the inspection device writes the temperature coefficients Kαlr and Kαrh of the gradient α, the temperature coefficients Kβlr and Kβrh of the intercept β, and the temperature coefficients KVFlr and KVFrh of the temperature monitor signal VF in the memory circuit MEM of the semiconductor chip CHP2b (Step S3057).

In this way, roughly speaking, the inspection device defines the information on the correction equation including the temperature dependence, and writes it in the memory circuit MEM. In the example of FIG. 9 and FIG. 11, the information on the correction equation includes the coefficients (that is, the gradient α and the intercept β) of a linear function and the value of the temperature monitor signal VF at each temperature, at Step S304 of FIG. 9. In addition, the information on the correction equation includes each coefficient indicative of the temperature dependence of the coefficients of the linear function (that is, the temperature coefficients Kαlr, Kαrh, Kβlr, and Kβrh), and the coefficient indicative of the temperature dependence of the temperature monitor signal VF (that is, the temperature coefficients KVFlr and KVFrh), at Step S3057 of FIG. 11.

Figure 13:
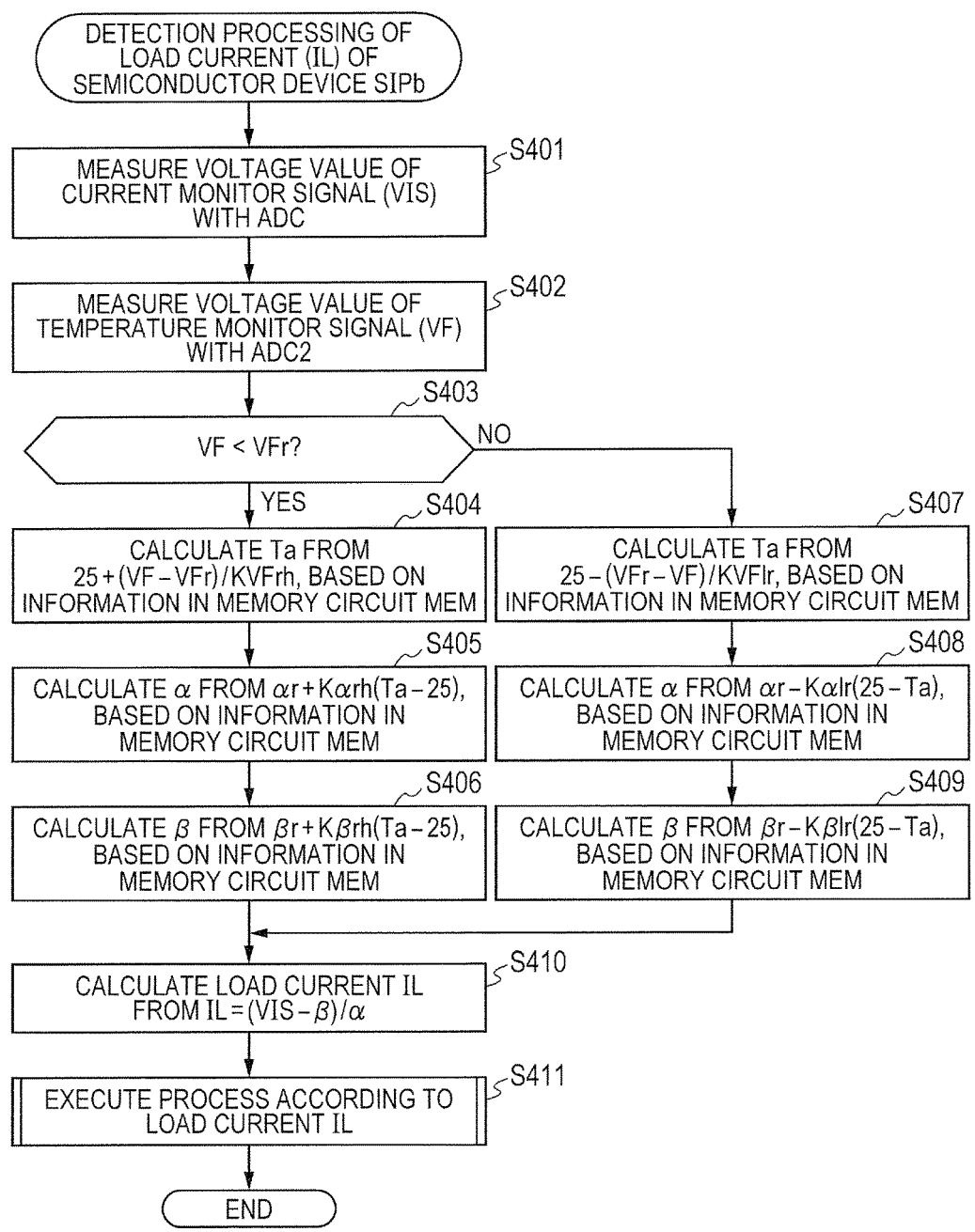
FIG. 13 is a flow chart illustrating an example of the contents of processing in detecting a load current in the semiconductor device according to FIG. 8A and FIG. 8B.

FIG. 13 is a flow chart illustrating an example of the contents of processing in detecting a load current in the semiconductor device according to FIG. 8A and FIG. 8B. The arithmetic processing circuit MPU in the semiconductor chip CHP2b performs a process as illustrated in FIG. 13 according to the prescribed program held in the memory circuit MEM. In FIG. 13, the arithmetic processing circuit MPU measures the voltage value of the current monitor signal VIS at the external terminal PNm2 first, with the analog-to-digital converter circuit ADC (Step S401).

Subsequently, the arithmetic processing circuit MPU measures the voltage value of the temperature monitor signal VF at the external terminal PNt2, with the analog-to-digital converter circuit ADC2 (Step S402). Subsequently, the arithmetic processing circuit MPU determines whether the measured voltage value of the temperature monitor signal VF is lower than the voltage value of the temperature monitor signal VFr at 25° C. held in the memory circuit MEM (Step S403). When VF<VFr, the temperature of the semiconductor chip CHP2b is determined to exist in the range from 25° C. to 150° C., as shown in FIG. 12B.

Therefore, when VF<VFr, the arithmetic processing circuit MPU calculates "25+(VF−VFr)/KVFrh" to obtain the temperature Ta, on the basis of the information held in the memory circuit MEM (Step S404). That is, as shown in FIG. 12B, under the assumption that the voltage value of the temperature monitor signal VF is proportional to temperature, the temperature Ta corresponding to the voltage value of the temperature monitor signal VF is calculated by making use of the proportionality factor (that is, the temperature coefficient KVFrh) in the range from 25° C. to 150° C.

Subsequently, the arithmetic processing circuit MPU calculates "αr+Kαrh×(Ta−25)" to obtain the gradient α on the basis of the information held in the memory circuit MEM (Step S405). That is, as shown in FIG. 12A, under the assumption that the value of the gradient α is proportional to temperature, the gradient α corresponding to the temperature Ta calculated at Step S404 by making use of the proportionality factor (that is, the temperature coefficient Kαrh) in the range from 25° C. to 150° C.

Similarly, the arithmetic processing circuit MPU calculates "βr+Kβrh×(Ta−25)" to obtain the intercept β on the basis of the information held in the memory circuit MEM (Step S406). That is, as shown in FIG. 12A, under the assumption that the value of the intercept β is proportional to temperature, the intercept β corresponding to the temperature Ta calculated at Step S404 is calculated by making use of the proportionality factor (that is, the temperature coefficient Kβrh) in the range from 25° C. to 150° C.

On the other hand, when VF≥VFr at Step S403, the temperature of the semiconductor chip CHP2b is determined to exist in the range from −40° C. to 25° C., as shown in FIG. 12B. Therefore, when VF≥VFr, the arithmetic processing circuit MPU calculates the temperature Ta, the gradient α, and the intercept β as is the case with Steps S404-S406, by making use of the information and the various temperature coefficients in the range from −40° C. to 25° C., held in the memory circuit MEM. When explained briefly, the arithmetic processing circuit MPU calculates the temperature Ta from "25−(VFr−VF)/KVFlr" (Step S407), the gradient α from "αr−Kαlr×(25−Ta)" (Step S408), and the intercept β from "βr−Kβlr×(25−Ta)" (Step S409).

Subsequently, the arithmetic processing circuit MPU determines the correction equation "VIS=α×IL+β (IL=(VIS−β)/α)" on the basis of the calculation result at Steps S404-S406 or Steps S407-S409. Then, the arithmetic processing circuit MPU corrects the digital signal (that is, the current monitor signal VIS) outputted from the analog-to-digital converter circuit ADC as is the case with FIG. 5, by making use of the correction equation. Accordingly, the arithmetic processing circuit MPU calculates the current value of the load current IL flowing through the load driving terminal PNld (Step S410).

In this way, roughly speaking, the arithmetic processing circuit MPU corrects the coefficients (the gradient α and the intercept β) of the correction equation (linear function) on the basis of the temperature monitor signal VF and various temperature coefficients (Kαlr, Kαrh, Kβlr, and Kβrh). Then, the arithmetic processing circuit MPU corrects the digital signal (the current monitor signal VIS) outputted from the analog-to-digital converter circuit ADC by making use of the correction equation including the corrected coefficient. Accordingly, the arithmetic processing circuit MPU calculates the current value of the load current IL flowing through the load driving terminal PNld (S411).

As described above, by employing the method of Embodiment 3, it becomes possible to offer the semiconductor device SIPb which further has the more precise current detecting function in addition to the various effects described in Embodiment 1. Specifically, as is the case with Embodiment 1, it is possible to correct the error factors (A)-(C) described in FIG. 18A and FIG. 18B, and in addition, it becomes possible further to correct the error factor (D) (that is, the temperature dependence of (A)-(C)).

For example, in the application to a vehicle, the electronic control unit is used under temperature environment as broad as from −40° C. to 150° C., for example; therefore, there is a possibility that the influence of an error factor (D) may become serious. On the other hand, as described in Embodiment 1, if the electronic control unit becomes an object of inspection, it is likely that performing the inspection in such a broad temperature is difficult from a practical standpoint. Therefore, it becomes useful to employ the method of Embodiment 3.

Here, the temperature sensor circuit TSEN is mounted in the semiconductor chip CHP1b, it is also possible to mount it in the semiconductor chip CHP2b, depending on circumstances. However, it is desirable to mount the temperature sensor circuit TSEN in the semiconductor chip CHP1b from the viewpoint of attaining the accuracy enhancement more (that is, from the viewpoint of detecting the temperature of a near part by the circuit as the object of correction). Moreover, it is also preferable to unify the external terminals PNt1 and PNt2 to one piece as is the case with Embodiment 2.

Furthermore, the information on the correction equation including the temperature dependence is not necessarily restricted to the information described in FIG. 9 and FIG. 11. It is also preferable to consolidate the equations properly such that with the equations the gradient α and the intercept β can be directly calculated from the temperature monitor signal VF, and to use the coefficient of the equations as the information on the correction equation. Alternatively, as described in Embodiment 1, it is also preferable to configure all or a part of the equation by a table, and to use the information on the table as the information on the correction equation.

Embodiment 4

A Configuration of a Semiconductor Device (Embodiment 4)

Figure 14A:
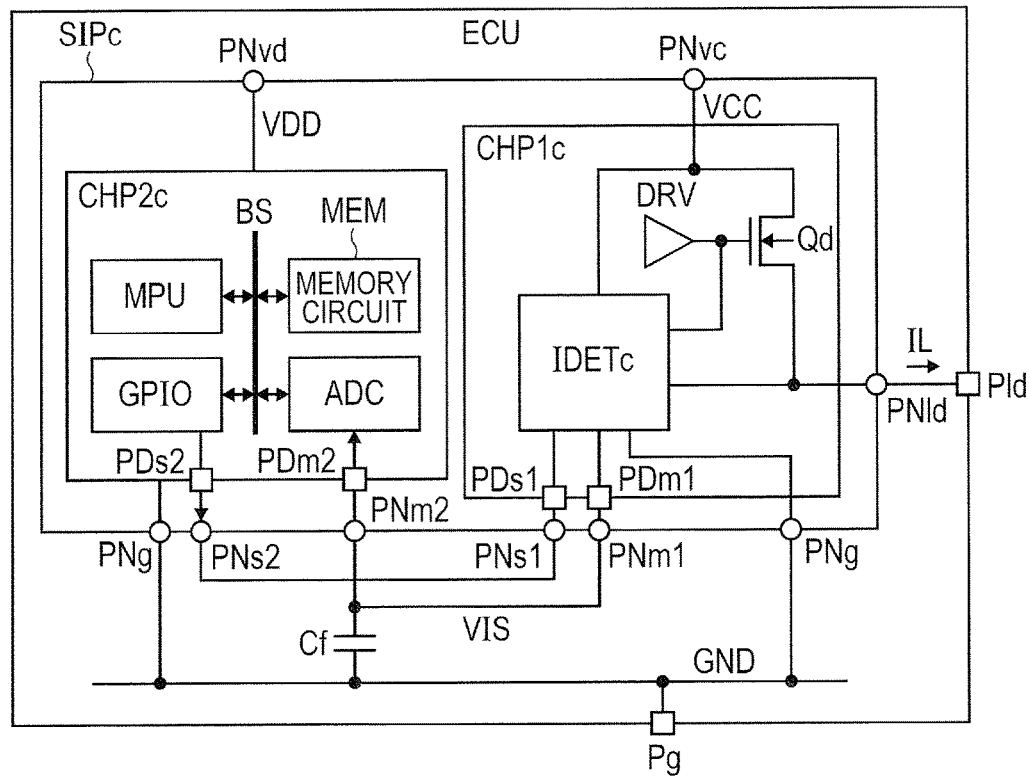
FIG. 14A is a circuit block diagram illustrating an example of the outline configuration of a principal part of an electronic control unit which includes a semiconductor device according to Embodiment 4 of the present invention.
Figure 14B:
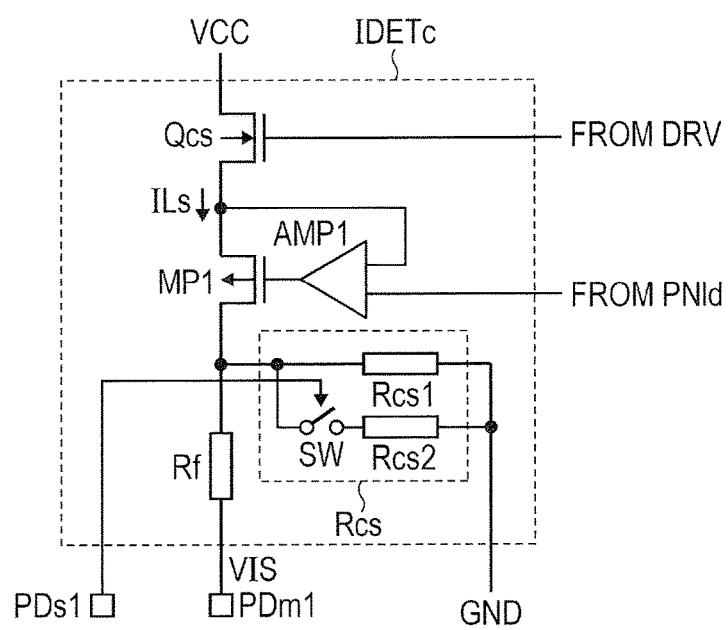
FIG. 14B is a circuit diagram illustrating an example of the configuration of a current detection circuit illustrated in FIG. 14A.

FIG. 14A is a circuit block diagram illustrating an example of the outline configuration of a principal part of an electronic control unit which includes a semiconductor device according to Embodiment 4 of the present invention. FIG. 14B is a circuit diagram illustrating an example of the configuration of a current detection circuit illustrated in FIG. 14A. An electronic control unit ECU illustrated in FIG. 14A is different from the example of the configuration of FIG. 2A, mainly in the configuration of the semiconductor device SIPc.

The semiconductor device SIPc illustrated in FIG. 14A includes external terminals PNs1 and PNs2, in addition to the external terminals PNvc, PNvd, PNg, PNld, PNm1, and PNm2, as illustrated in FIG. 2A. Moreover, the semiconductor chip CHP2c illustrated in FIG. 14A further includes a general-purpose IO interface circuit GPIO coupled to a bus BS in comparison to the semiconductor chip CHP2 illustrated in FIG. 2A. The semiconductor chip CHP1c illustrated in FIG. 14A is different from the semiconductor chip CHP1 illustrated in FIG. 2A, in the configuration of the current detection circuit IDETc. As illustrated in FIG. 14B, the current detection circuit IDETc is different from the current detection circuit IDET illustrated in FIG. 2B in that the current detection resistor Rcs is a variable resistor capable of setting plural values of resistance.

In the example of FIG. 14B, the current detection resistor Rcs includes a current detection resistor Rcs1 which is coupled between the drain of a PMOS transistor MP1 and the ground power supply voltage GND, and a switch SW and a current detection resistor Rcs2 which are coupled in series between both ends of the current detection resistor Rcs1. For example, when the values of resistance of the current detection resistors Rcs1 and Rcs2 are equal, the value of resistance of the current detection resistor Rcs becomes half when the switch SW is turned ON.

The semiconductor chip CHP1c includes an electrode pad (terminal) PDs1 for setting the value of resistance by controlling ON/OFF of the switch SW. The electrode pad PDs1 is coupled to the external terminal PNs1. The external terminal PNs1 is coupled to the external terminal PNs2 via the wiring substrate of the electronic control unit ECU, and coupled to the electrode pad PDs2 via the external terminal PNs2. Accordingly, the arithmetic processing circuit MPU of the semiconductor chip CHP2c can set the value of resistance of the current detection resistor Rcs via the electrode pad PDs1, by outputting a prescribed signal to the electrode pad PDs2 via the bus BS and the general-purpose IO interface circuit GPIO.

In such a configuration in Embodiment 4, the memory circuit MEM of the semiconductor chip CHP2c holds the information on the correction equation obtained in the inspection process of the semiconductor device SIPc, for each value of resistance which can be set as the current detection resistor Rcs. Moreover, the arithmetic processing circuit MPU sets the value of resistance of the current detection resistor Rcs via the electrode pad (terminal) PDs1, and corrects the digital signal (that is, the current monitor signal VIS) outputted from the analog-to-digital converter circuit ADC by making use of the correction equation corresponding to the value of resistance of the current detection resistor Rcs. Consequently, the arithmetic processing circuit MPU calculates the current value of the load current IL flowing through the load driving terminal PNld.

A Current Detection Method of a Semiconductor Device (Embodiment 4)

Figure 15:
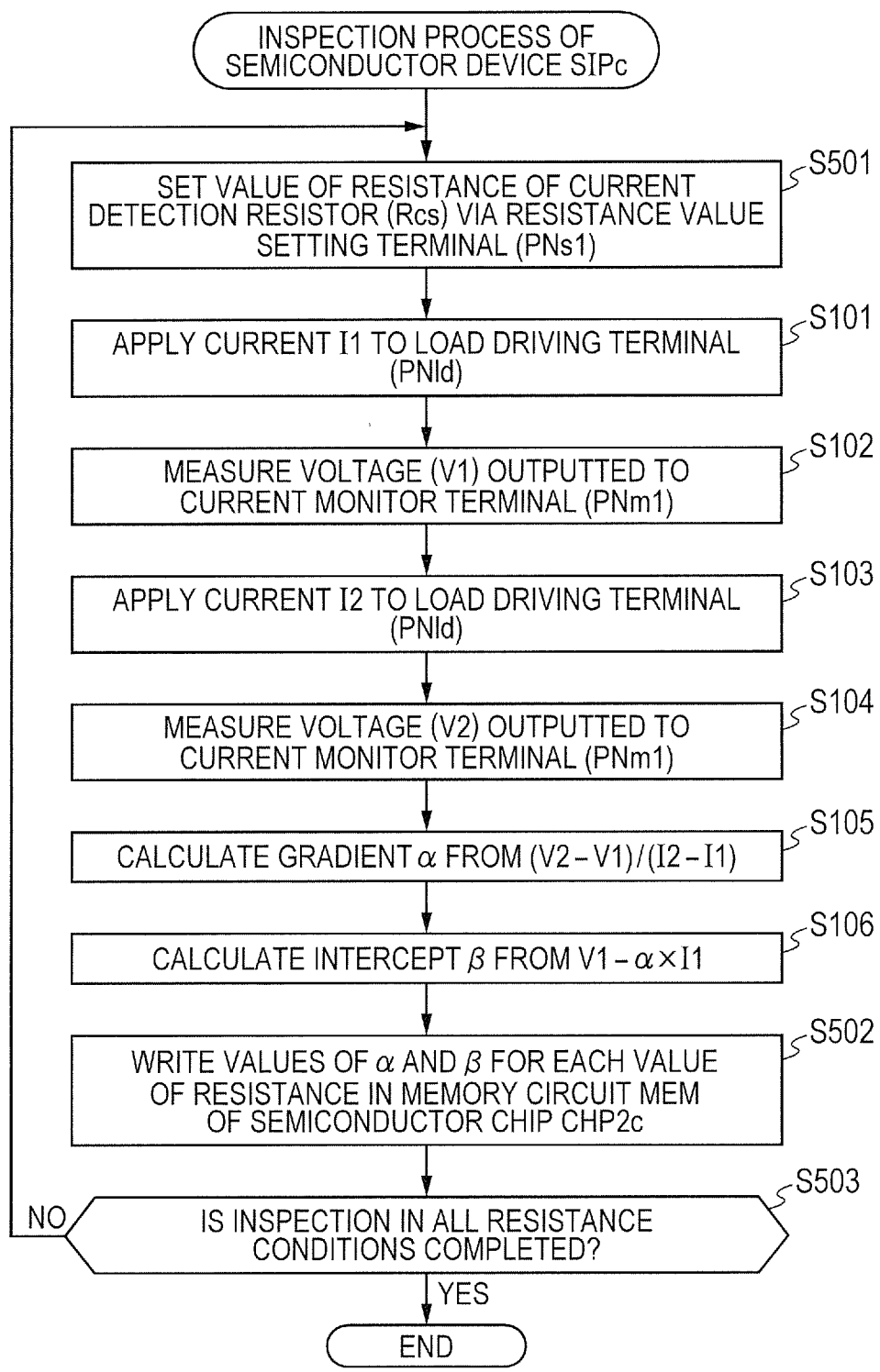
FIG. 15 is a flow chart illustrating an example of an inspection process in the semiconductor device illustrated in FIG. 14A and FIG. 14B.

FIG. 15 is a flow chart illustrating an example of an inspection process in the semiconductor device illustrated in FIG. 14A and FIG. 14B. In FIG. 15, first, a prescribed inspection device sets the value of resistance of the current detection resistor Rcs via the external terminal (resistance value setting terminal) PNs1 (Step S501). Next, the inspection device executes Steps S101-S106 described in FIG. 3, and Step S502 which is similar to Step S107.

Subsequently, the inspection device determines whether the inspection under all of the conditions of the resistance is completed (Step S503). When the inspection under all of the conditions of the resistance is not completed, the inspection device returns to Step S501 to repeat the similar process. During this repetition, the inspection device writes the information on the correction equation for each value of resistance (here the values of the gradient α and the intercept β) in the memory circuit MEM of the semiconductor chip CHP2c at Step S502. Accordingly, when detecting the load current IL, the arithmetic processing circuit MPU may set the value of resistance of the current detection resistor Rcs, and at the same time, the arithmetic processing circuit MPU may read from the memory circuit MEM the information on the correction equation corresponding to the value of resistance, and may calculate the load current IL from the current monitor signal VIS by making use of the correction equation.

As described above, by employing the method of Embodiment 4, it is possible to further acquire the following effects in addition to the various effects described in Embodiment 1. First, as a premise, when the current detection resistor Rcs is mounted inside as in Embodiment 1, the measuring range of the current value of the load current IL is fixed corresponding to the value of resistance. In this case, when the application of the semiconductor device is fixed to some extent (when the rated power of the load LOD is fixed) for example, the value of resistance is also fixed, and no problem arises in particular.

However, there are cases where the electro-component assembly company wants to apply the semiconductor device to various kinds of loads LOD, or to change the measuring range of the current value temporarily. When the method of Embodiment 4 is employed in such a case, the electro-component assembly company can set the measuring range of the current value, and can improve the degree of freedom in the current measurement. Furthermore, in each of the measuring ranges set in this way, it is possible to realize the accuracy enhancement of the current detection.

In the example of FIG. 14B, one set of the combination of the current detection resistor Rcs2 and the switch SW is provided; however, it is preferable to provide two sets or more. However, when the number of sets increases, the number of the electrode pad PDs1 (and the number of wirings accompanying it) also increases. Therefore, in order to reduce the number of the electrode pad PDs1, it is also preferable to adopt a configuration in which a decoder is mounted in the semiconductor chip CHP1c so as to control ON/OFF of each switch SW via the decoder, for example.

Moreover, in FIG. 14A, the external terminals PNs1 and PNs2 are provided and coupled mutually over the wiring substrate of the electronic control unit ECU. However, as is the case with Embodiment 2, it is also preferable to couple the electrode pads PDs1 and PDs2 inside the semiconductor device CHP1c. However, in the present case, the electrode pad PDs2 and the external terminal PNs2 serve as the dedicated terminals. On the other hand, there is cases where the electro-component assembly company uses only the current detecting resistor Rcs1. In this case, by employing the example of the configuration of FIG. 14A, the electro-component assembly company can use the electrode pad PDs2 and the external terminal PNs2 (for example, a GPIO (General Purpose Input Output) port) for other applications. At this time, the electro-component assembly company just has to couple the external terminal PNs1 to the ground power supply voltage GND.

Furthermore, as a matter of course, the method of Embodiment 4 can be combined with Embodiment 3. In this case, it is possible to perform the inspection, changing the temperature for each value of resistance.

Embodiment 5

A Configuration of a Semiconductor Device (Embodiment 5)

Figure 16A:
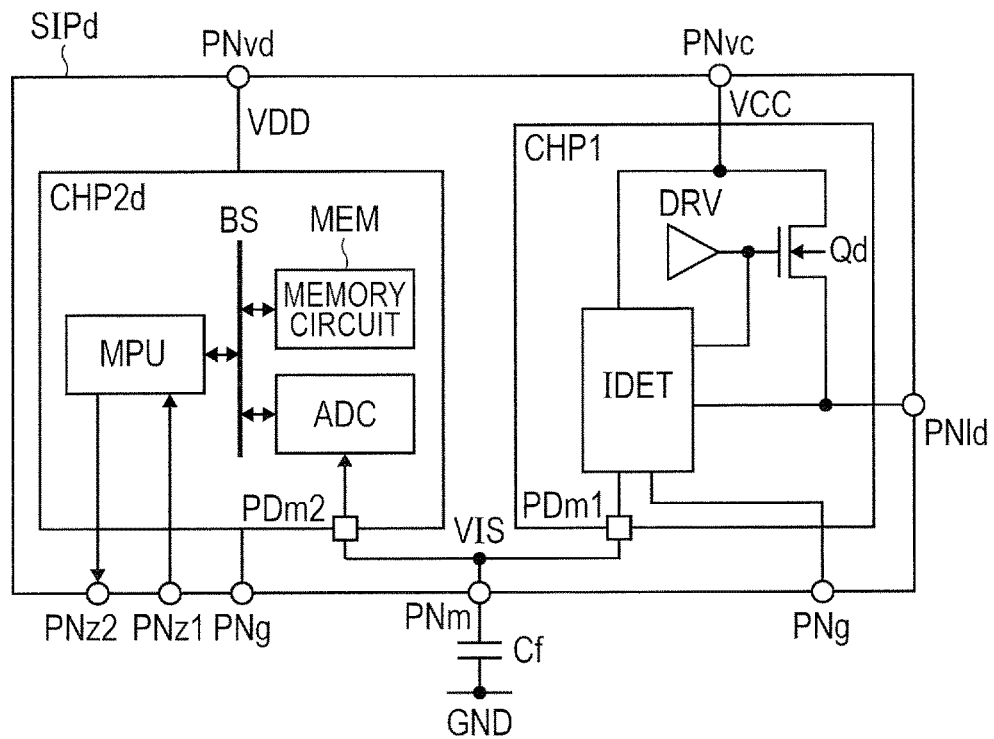
FIG. 16A is a circuit block diagram illustrating an example of the outline configuration of a principal part of a semiconductor device according to Embodiment 5 of the present invention.
Figure 16B:
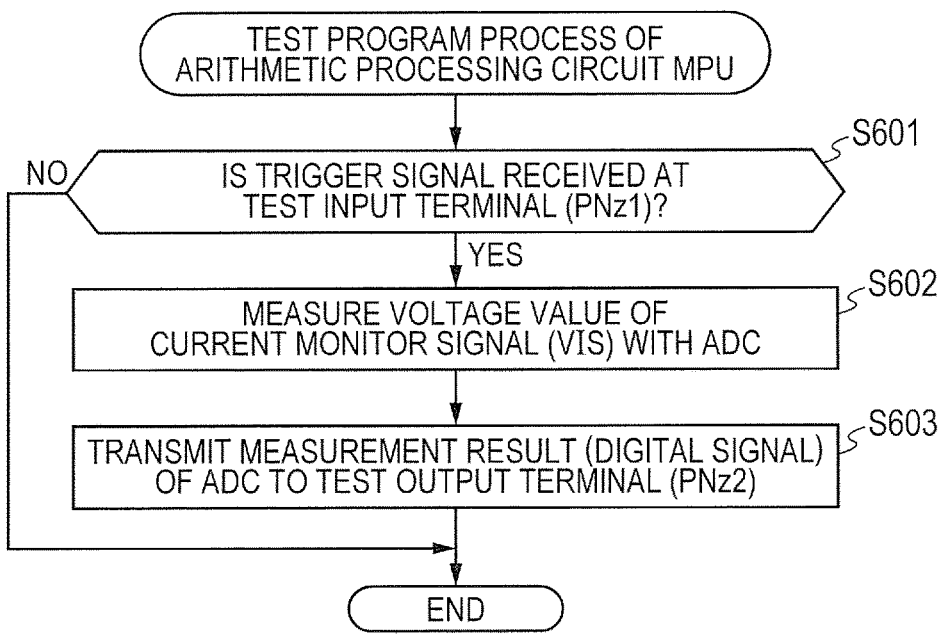
FIG. 16B is a flow chart illustrating an example of contents of processing of an arithmetic processing circuit illustrated in FIG. 16A.

FIG. 16A is a circuit block diagram illustrating an example of the outline configuration of a principal part of a semiconductor device according to Embodiment 5 of the present invention. FIG. 16B is a flow chart illustrating an example of contents of processing of an arithmetic processing circuit illustrated in FIG. 16A. The semiconductor device SIPd illustrated in FIG. 16A is different from the semiconductor device SIPa illustrated in FIG. 6 and FIG. 7 in that the semiconductor device SIPd further includes external terminals PNz1 and PNz2 and has a test program implemented therein.

The arithmetic processing circuit MPU executes a process as illustrated in FIG. 16B for example, based on the test program held in the memory circuit MEM. In FIG. 16B, the arithmetic processing circuit MPU determines whether a trigger signal is received at the external terminal (test input terminal) PNz1 (Step S601). When a trigger signal is received, the arithmetic processing circuit MPU measures a voltage value of the current monitor signal VIS with use of the analog-to-digital converter circuit ADC (Step S602). Subsequently, the arithmetic processing circuit MPU transmits the measurement result (a digital signal) of the analog-to-digital converter circuit ADC to the external terminal (test output terminal) PNz2 (Step S603).

A Current Detection Method of the Semiconductor Device (Embodiment 5)

Figure 17:
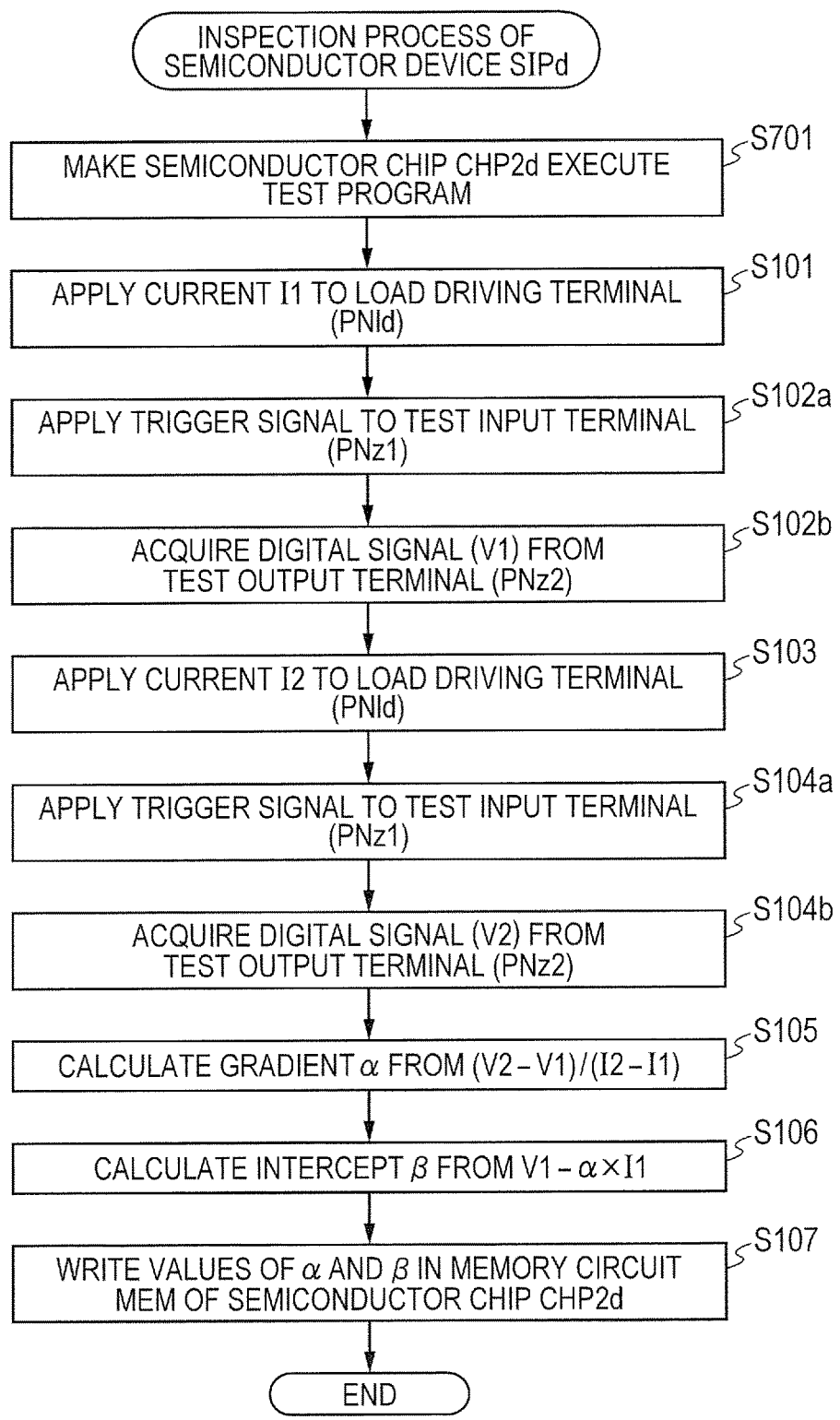
FIG. 17 is a flow chart illustrating an example of an inspection process in a semiconductor device illustrated in FIG. 16A and FIG. 16B.

FIG. 17 is a flow chart illustrating an example of an inspection process in the semiconductor device illustrated in FIG. 16A and FIG. 16B. The inspection process illustrated in FIG. 17 is different from the inspection process illustrated in FIG. 3 in that Step S701 is added, that Step S102 of FIG. 3 is changed to Steps S102a and S102b of FIG. 17, and that Step S104 of FIG. 3 is changed to Steps S104a and S104b of FIG. 17.

In FIG. 17, first, a prescribed inspection device makes the semiconductor chip CHP2d execute a test program as illustrated in FIG. 16B (Step S701). Subsequently, in a state where a current I1 is applied to the load driving terminal PNld (Step S101), the prescribed inspection device applies a trigger signal to a test input terminal PNz1 (Step S102a). Responding to this, as illustrated in FIG. 16B, the arithmetic processing circuit MPU measures a voltage V1 of a current monitor signal VIS, on the basis of a digital signal outputted from the analog-to-digital converter circuit ADC, and outputs the digital signal to the test output terminal PNz2. The inspection device acquires the digital signal (that is, the voltage V1) from the test output terminal PNz2 (Step S102b).

Similarly, in a state where a current I2 is applied to the load driving terminal PNld (Step S103), the inspection device applies a trigger signal to the test input terminal PNz1 (Step S104a). Responding to this, the arithmetic processing circuit MPU measures a voltage V2 of a current monitor signal VIS, on the basis of a digital signal outputted from the analog-to-digital converter circuit ADC, and outputs the digital signal to the test output terminal PNz2. The inspection device acquires the digital signal (that is, the voltage V2) from the test output terminal PNz2 (Step S104b).

As described above, unlike the method according to Embodiment 1, in the method according to Embodiment 5, not the inspection device but the analog-to-digital converter circuit ADC in the semiconductor chip CHP2d measures the voltages V1 and V2 instead. Then, the inspection device determines the information on the correction equation (here the gradient $\alpha$ and the intercept $\beta$) on the basis of the measurement result (Steps S105-S107).

As a result, by employing the method according to Embodiment 5, it becomes possible further to perform the correction including the conversion error of the analog-to-digital converter circuit ADC, in addition to the various effects described in Embodiment 1. Accordingly, the accuracy enhancement of the current detection can be attained further in some cases. Note that the external terminals PNz1 and PNz2 do not need to be the dedicated terminals for the test in particular, and that they need only to be provided in the form of using the existing external terminal together (that is, in the form where it functions as a test terminal only at the time of executing the test program).

As described above, the invention accomplished by the present inventors has been concretely explained on the basis of the embodiments. However, the present invention is not restricted to the embodiments as described above, and it can be changed variously in the range which does not deviate from the gist. For example, the above embodiments are described in detail, in order to explain the present invention plainly, and they are not necessarily restricted to one which includes all the configurations explained in the above. Moreover, it is possible to replace a part of the configuration of a certain embodiment with the configuration of other embodiment, and it is also possible to add the configuration of other embodiment to the configuration of a certain embodiment. Moreover, it is possible to perform addition, deletion, and substitution of other configurations as for apart of the configuration of each embodiment.

For example, the present disclosure has explained, as an example, the case where the information on the correction equation obtained in the inspection process of the semiconductor device (the inspection result of the current detection circuit of the semiconductor chip) is written in the memory circuit of the semiconductor chip, and on the basis of this, the current detection result in the semiconductor chip is corrected. However, the essence of the present embodiment is to store various kinds of inspection information on various detection circuits of a semiconductor chip into a memory circuit of another semiconductor chip, and to correct the detection result of the various detection circuits of the semiconductor chip, on the basis of the stored inspection information, and it is not necessarily restricted to the case of the current detection described above.

What is claimed is:

1. A current detection method of a semiconductor device comprising a first semiconductor chip and a second semiconductor chip which are mounted in one package, and a load driving terminal, wherein the first semiconductor chip comprises an electric power supply transistor operable to supply power to a load via the load driving terminal, and a current detection circuit operable to detect a current flowing through the load driving terminal, wherein the second semiconductor chip comprises a memory circuit, the method comprising:
    in an inspection process of the semiconductor device:
        inspecting an electrical property of the current detection circuit in the first semiconductor chip;
        writing information on a correction equation obtained on the basis of an inspection result in the memory circuit of the second semiconductor chip; and
        correcting, with the second semiconductor chip, a detection result obtained by the current detection circuit on the basis of the information on the correction equation.

2. The current detection method of the semiconductor device according to claim 1, wherein the first semiconductor chip further comprises a first terminal,
    wherein the current detection circuit comprises a current detection resistor operable to output a voltage reflecting the current flowing through the load driving terminal to the first terminal, and
    wherein the second semiconductor chip further comprises:
        a second terminal to be coupled to the first terminal;
        an analog-to-digital converter circuit operable to convert an analog signal inputted to the second terminal into a digital signal; and
        an arithmetic processing circuit operable to process the digital signal.

3. The current detection method of the semiconductor device according to claim 2, wherein the inspection process of the semiconductor device comprises:
    a first process of applying a first current to the load driving terminal and measuring a first voltage outputted to the first terminal;
    a second process of applying a second current with a different current value from the first current to the load driving terminal and measuring a second voltage outputted to the first terminal;
    a third process of defining the information on the correction equation on the basis of the relation between the difference of the first current and the second current and the difference of the first voltage and the second voltage; and
    a fourth process of writing the information on the correction equation to the memory circuit, and
    wherein the arithmetic processing circuit calculates the current value of the current flowing through the load driving terminal, by correcting the digital signal with the use of the correction equation.

4. The current detection method of the semiconductor device according to claim 3, wherein the correction equation is a linear function, and
    wherein the information on the correction equation is a coefficient of the linear function.

5. The current detection method of the semiconductor device according to claim 3, wherein one of the first semiconductor chip and the second semiconductor chip further comprises a temperature sensor circuit operable to output a temperature monitor signal with a value indicative of temperature,
    wherein the inspection process of the semiconductor device further comprises:
        a fifth process of executing the first process, the second process, and the third process, in the state where the semiconductor device is placed under the environment of a first temperature, to further measure the temperature monitor signal;
        a sixth process of executing the first process, the second process, and the third process, in the state where the semiconductor device is placed under the environment of a second temperature different from the first temperature, to further measure the temperature monitor signal;
        a seventh process of defining the information on the correction equation including the temperature dependence, on the basis of the information on the correction equation and the measurement result of the temperature monitor signal, obtained in the fifth process, and the information on the correction equation and the measurement result of the temperature monitor signal, obtained in the sixth process; and
        an eighth process of writing the information on the correction equation including the temperature dependence to the memory circuit, and
    wherein the arithmetic processing circuit calculates the current value of the current flowing through the load driving terminal, by correcting the digital signal with the use of the correction equation according to the temperature monitor signal.

6. The current detection method of the semiconductor device according to claim 5, wherein the information on the correction equation including the temperature dependence includes a coefficient of a linear function and a temperature coefficient indicative of the temperature dependence of the coefficient of the linear function, and wherein the arithmetic processing circuit calculates the current value of the current flowing through the load driving terminal, by correcting the coefficient of the linear function on the basis of the temperature monitor signal and the temperature coefficient, and correcting the digital signal with the use of the linear function with the corrected coefficient.

7. The current detection method of the semiconductor device according to claim 3, wherein the current detection resistor is a variable resistor capable of setting a plurality of values of resistance,
wherein the first semiconductor chip further comprises a third terminal to set the values of resistance,
wherein, in the inspection process of the semiconductor device, the value of resistance of the current detection resistor is set via the third terminal and the first process, the second process, the third process, and the fourth process are executed for each of the values of resistance, and
wherein the arithmetic processing circuit calculates the current value of the current flowing through the load driving terminal, by setting the value of resistance of the current detection resistor via the third terminal, and correcting the digital signal with the use of the correction equation corresponding to the value of resistance of the current detection resistor.

8. The current detection method of the semiconductor device according to claim 3, wherein wiring to couple the first terminal with the second terminal is provided in the package, and
wherein in the first process and the second process, a prescribed inspection device applies the first current and the second current, and the arithmetic processing circuit measures the first voltage and the second voltage on the basis of the digital signal outputted from the analog-to-digital converter circuit.

9. The current detection method of the semiconductor device according to claim 1, wherein the semiconductor device is employed in an electronic control unit (ECU) of a vehicle.

10. The current detection method of the semiconductor device according to claim 1, wherein the current detection circuit comprises a current detection resistor operable to detect a current flowing through the load driving terminal.

11. A semiconductor device comprising:
a first semiconductor chip;
a second semiconductor chip, the first semiconductor chip and the second semiconductor chip being mounted in one package; and
a load driving terminal,
wherein the first semiconductor chip comprises:
an electric power supply transistor operable to supply power to a load via the load driving terminal;
a driver circuit operable to drive the electric power supply transistor;
a first terminal; and
a current detection resistor operable to detect a current flowing through the load driving terminal and to output a voltage reflecting the current concerned to the first terminal, and
wherein the second semiconductor chip comprises:
a second terminal to be coupled to the first terminal;
an analog-to-digital converter circuit operable to convert an analog signal inputted to the second terminal into a digital signal;
a memory circuit operable to hold information on a correction equation obtained in an inspection process of the semiconductor device; and
an arithmetic processing circuit operable to calculate a current value of a current flowing through the load driving terminal by correcting the digital signal with the use of the correction equation.

12. The semiconductor device according to claim 11, wherein wiring to couple the first terminal and the second terminal is provided in the package.

13. The semiconductor device according to claim 11, wherein the first semiconductor chip further comprises a current detection transistor with a transistor size of a prescribed ratio relative to the electric power supply transistor and driven by the driver circuit in parallel with the electric power supply transistor, and operable to make flow a current reflecting the current flowing through the electric power supply transistor, and
wherein the current detection resistor is coupled to the current detection transistor in series.

14. The semiconductor device according to claim 13, wherein the first semiconductor chip further comprises a first resistor coupled between one end of the current detection resistor and the first terminal and configuring one part of a low pass filter, and
wherein the first terminal is coupled to an external terminal of the package, and a capacitor configuring the other part of the low pass filter is coupled to the external terminal concerned.

15. The semiconductor device according to claim 11, wherein the current detection resistor is a variable resistor operable to set a plurality of values of resistance,
wherein the first semiconductor chip further comprises a third terminal to set the values of resistance, and
wherein the memory circuit holds the information on the correction equation for each of the values of resistance, obtained in the inspection process of the semiconductor device.

16. The semiconductor device according to claim 11, wherein the correction equation is a linear function, and
wherein the information on the correction equation is a coefficient of the linear function.

17. The semiconductor device according to claim 11, wherein one of the first semiconductor chip and the second semiconductor chip further comprises a temperature sensor circuit operable to output a temperature monitor signal with a value indicative of temperature,
wherein the memory circuit further holds the information on the correction equation including the temperature dependence obtained in the inspection process of the semiconductor device, and
wherein the arithmetic processing circuit calculates the current value of the current flowing through the load driving terminal, by correcting the digital signal with the use of the correction equation according to the temperature monitor signal.

18. The semiconductor device according to claim 11, wherein the semiconductor device is employed in an electronic control unit (ECU) of a vehicle.

19. A current detection method of a semiconductor device comprising, a load driving terminal, a first semiconductor chip including a current detection circuit operable to detect a current flowing through the load driving terminal, and a second semiconductor chip including a memory circuit, the method comprising:
inspecting an electrical property of the current detection circuit in the first semiconductor chip;

writing information on a correction equation obtained on the basis of an inspection result in the memory circuit of the second semiconductor chip; and correcting, with the second semiconductor chip, a detection result obtained by the current detection circuit on the basis of the information on the correction equation.

* * * * *